United States Patent
Yamazaki

(10) Patent No.: US 9,620,650 B2
(45) Date of Patent: Apr. 11, 2017

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/741,515

(22) Filed: Jun. 17, 2015

(65) Prior Publication Data

US 2015/0287835 A1     Oct. 8, 2015

Related U.S. Application Data

(63) Continuation of application No. 13/959,919, filed on Aug. 6, 2013, now Pat. No. 9,082,863.

(30) Foreign Application Priority Data

Aug. 10, 2012   (JP) .................................. 2012-178617

(51) Int. Cl.
*H01L 29/786* (2006.01)
*H01L 29/10* (2006.01)
(Continued)

(52) U.S. Cl.
CPC .... *H01L 29/78693* (2013.01); *H01L 27/1225* (2013.01); *H01L 29/045* (2013.01); *H01L 29/1037* (2013.01); *H01L 29/7869* (2013.01)

(58) Field of Classification Search
CPC ............. H01L 29/78693; H01L 29/045; H01L 29/1037; H01L 29/7869; H01L 27/1225
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    102668028 A    9/2012
EP       1737044 A   12/2006
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — Whitney T Moore
(74) *Attorney, Agent, or Firm* — Fish & Richardson P.C.

(57) ABSTRACT

The present invention provides a transistor having electrically stable characteristics. In addition, the reliability of a semiconductor device including such a transistor is increased. The semiconductor device includes a gate electrode layer, a gate insulating film over the gate electrode layer, an oxide semiconductor stacked film overlapping with the gate electrode layer with the gate insulating film provided therebetween, and a pair of electrode layers in contact with the oxide semiconductor stacked film. In the semiconductor device, the oxide semiconductor stacked film includes at least indium and includes a first oxide semiconductor layer, a second oxide semiconductor layer, and a third oxide semiconductor layer which are sequentially stacked. Further, the first oxide semiconductor layer has an amorphous structure, the second oxide semiconductor layer and the third oxide semiconductor layer include a crystal part whose c-axis is substantially perpendicular to a top surface of the oxide semiconductor stacked film.

16 Claims, 19 Drawing Sheets

(51) Int. Cl.
  *H01L 27/12* (2006.01)
  *H01L 29/04* (2006.01)

(56) References Cited

U.S. PATENT DOCUMENTS

| | | |
|---|---|---|
| 6,146,928 A | 11/2000 | Ishiguro et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,492,758 B2 | 7/2013 | Yamazaki et al. |
| 8,890,152 B2 | 11/2014 | Yamazaki et al. |
| 8,890,159 B2 | 11/2014 | Yamazaki et al. |
| 8,901,552 B2 | 12/2014 | Yamazaki et al. |
| 9,117,919 B2 | 8/2015 | Yamazaki et al. |
| 9,343,584 B2 | 5/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0081826 A1 | 3/2009 | Cowdery-Corvan et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0250693 A1 | 10/2009 | Jeong et al. |
| 2009/0278122 A1 | 11/2009 | Hosono et al. |
| 2009/0280600 A1 | 11/2009 | Hosono et al. |
| 2010/0038641 A1 | 2/2010 | Imai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0224873 A1 | 9/2010 | Sakata et al. |
| 2010/0320458 A1 | 12/2010 | Umeda et al. |
| 2010/0320459 A1 | 12/2010 | Umeda et al. |
| 2011/0017990 A1 | 1/2011 | Son et al. |
| 2011/0068335 A1 | 3/2011 | Yamazaki et al. |
| 2011/0089417 A1 | 4/2011 | Yamazaki et al. |
| 2011/0127521 A1 | 6/2011 | Yamazaki |
| 2011/0140100 A1 | 6/2011 | Takata et al. |
| 2011/0156026 A1 | 6/2011 | Yamazaki et al. |
| 2011/0193083 A1 | 8/2011 | Kim et al. |
| 2011/0215328 A1 | 9/2011 | Morosawa et al. |
| 2011/0298027 A1 | 12/2011 | Isobe et al. |
| 2012/0043541 A1 | 2/2012 | Godo et al. |
| 2012/0119205 A1 | 5/2012 | Taniguchi et al. |
| 2012/0129288 A1 | 5/2012 | Kobayashi et al. |
| 2012/0132903 A1 | 5/2012 | Yamazaki et al. |
| 2012/0155150 A1 | 6/2012 | Nagatsuka et al. |
| 2012/0161139 A1 | 6/2012 | Endo et al. |
| 2012/0181534 A1 | 7/2012 | Hatano |
| 2012/0305913 A1 | 12/2012 | Yamazaki et al. |
| 2012/0319102 A1* | 12/2012 | Yamazaki ........... H01L 29/7869 257/43 |
| 2012/0319183 A1 | 12/2012 | Yamazaki et al. |
| 2013/0320330 A1 | 12/2013 | Yamazaki |
| 2013/0320334 A1 | 12/2013 | Yamazaki et al. |
| 2013/0334533 A1 | 12/2013 | Yamazaki |
| 2014/0001465 A1 | 1/2014 | Yamazaki |
| 2014/0008647 A1 | 1/2014 | Yamazaki |
| 2014/0014947 A1 | 1/2014 | Yamazaki |
| 2014/0027762 A1 | 1/2014 | Tsurume et al. |
| 2014/0042433 A1 | 2/2014 | Yamazaki |
| 2014/0042434 A1 | 2/2014 | Yamazaki |
| 2014/0042435 A1 | 2/2014 | Yamazaki |

(56) References Cited

U.S. PATENT DOCUMENTS

| | | |
|---|---|---|
| 2014/0042436 A1 | 2/2014 | Yamazaki |
| 2014/0042437 A1 | 2/2014 | Yamazaki |
| 2014/0042438 A1 | 2/2014 | Yamazaki |

FOREIGN PATENT DOCUMENTS

| | | |
|---|---|---|
| EP | 2226847 A | 9/2010 |
| EP | 2466587 A | 6/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2011-091375 A | 5/2011 |
| JP | 2011-109079 A | 6/2011 |
| JP | 2011-135066 A | 7/2011 |
| JP | 2011-243745 A | 12/2011 |
| JP | 2012-142562 A | 7/2012 |
| JP | 2012-146965 A | 8/2012 |
| JP | 2012-160679 A | 8/2012 |
| JP | 2012-253363 A | 12/2012 |
| KR | 2012-0068736 A | 6/2012 |
| KR | 2012-0073127 A | 7/2012 |
| KR | 2012-0079838 A | 7/2012 |
| KR | 2012-0109526 A | 10/2012 |
| TW | 201126717 | 8/2011 |
| TW | 201137984 | 11/2011 |
| TW | 201232668 | 8/2012 |
| TW | 201241932 | 10/2012 |
| TW | 201246458 | 11/2012 |
| WO | WO-2004/114391 | 12/2004 |
| WO | WO-2008/133345 | 11/2008 |
| WO | WO-2011/036999 | 3/2011 |
| WO | WO-2011/065216 | 6/2011 |

OTHER PUBLICATIONS

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

International Search Report (Application No. PCT/JP2013/071089) Dated Sep. 10, 2013.

Written Opinion (Application No. PCT/JP2013/071089) Dated Sep. 10, 2013.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest D7 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B(Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

(56) References Cited

OTHER PUBLICATIONS

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kim.T et al., "Effect of the Ga Ratio on the Dielectric Function of Solution-processed InGaZnO Films", J. Korean Phys. Soc.(Journal of the Korean Physical Society), Dec. 1, 2011, vol. 59, No. 6, pp. 3396-3400.

Taiwanese Office Action (Application No. 102127430) Dated Dec. 21, 2016.

\* cited by examiner

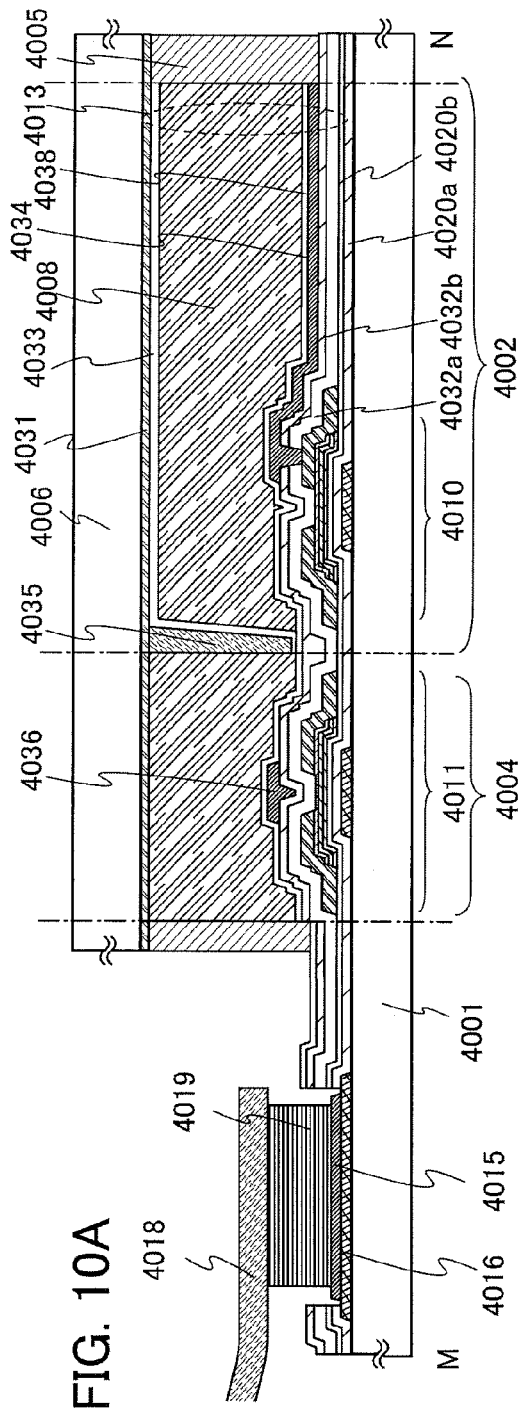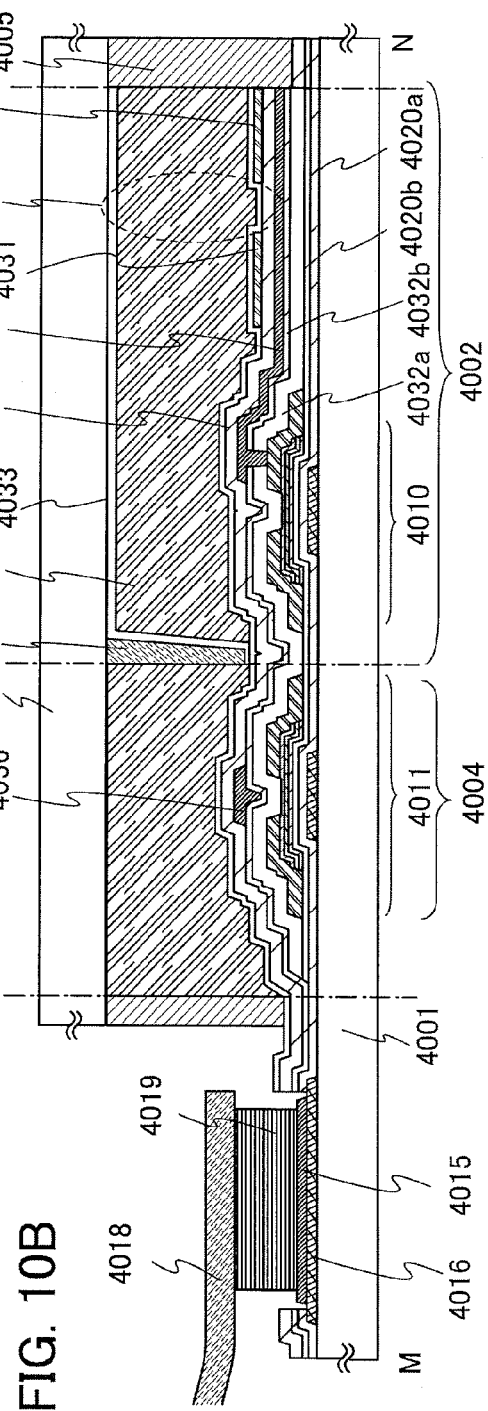

701c

701b

701c

701b

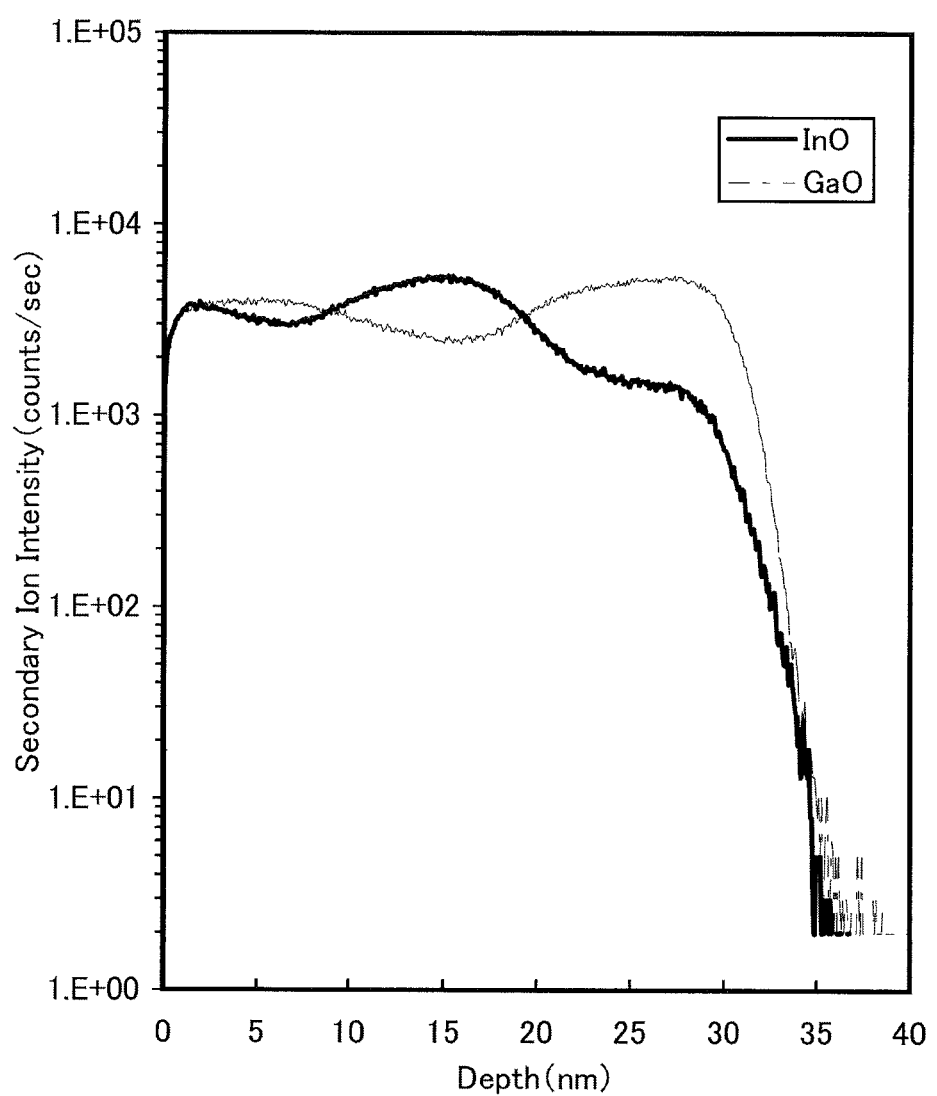

SEMICONDUCTOR DEVICE AND MANUFACTURING METHOD THEREOF

CROSS-REFERENCE TO RELATED APPLICATIONS

This application is a continuation of U.S. application Ser. No. 13/959,919, filed Aug. 6, 2013, now allowed, which claims the benefit of foreign a priority application filed in Japan as Serial No. 2012-178617 on Aug. 10, 2012, both of which are incorporated by reference.

TECHNICAL FIELD

The present invention relates to a semiconductor device including a field-effect transistor including an oxide semiconductor stacked film and a manufacturing method thereof.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used in transistors. Note that in this specification and the like, a metal oxide exhibiting semiconductor characteristics is referred to as an oxide semiconductor.

For example, such a technique is disclosed that a transistor is manufactured using zinc oxide or an In—Ga—Zn-based oxide as an oxide semiconductor and the transistor is used as a switching element or the like in a pixel of a display device (see Patent Documents 1 and 2).

Non-Patent Document 1 reports that defect states with extremely high densities of $1 \times 10^{20}/cm^3$ or more are observed in an amorphous In—Ga—Zn—O film and that the defect states are reduced in half by heat treatment.

REFERENCE

Non-Patent Document

[Non-Patent Document 1] Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633

Patent Document

[Patent Document 1] Japanese Published Patent Application No. 2007-123861
[Patent Document 2] Japanese Published Patent Application No. 2007-096055

DISCLOSURE OF INVENTION

There is a problem in transistors including an oxide semiconductor in that electrical characteristics, typically the threshold voltage, vary with time or by bias-temperature stress test (also referred to as gate bias temperature (GBT) test). For example, in the case where the density of defect states in an oxide semiconductor has the value described in Non-Patent Document 1, the transistor including the oxide semiconductor may cause variation in electrical characteristics such as the threshold voltage.

Such a variation in electrical characteristics of the transistor is a cause of a reduction in the reliability of a semiconductor device that uses the transistor.

In view of the above problem, an object of one embodiment of the present invention is to provide a transistor having electrically stable characteristics. Another object is to improve the reliability of a semiconductor device including such a transistor.

One embodiment of the present invention is a transistor having a stacked structure of oxide semiconductor layers, which includes at least a first oxide semiconductor layer having an amorphous structure, a second oxide semiconductor layer having a crystal structure stacked over the first oxide semiconductor layer, and a third oxide semiconductor layer stacked over the second oxide semiconductor layer.

The second oxide semiconductor layer having a crystal structure serves as a carrier path; carriers move in a region with a low oxygen vacancy content. This structure allows carriers to flow in a region that is apart from the silicon-containing insulating film and disposed over or below the oxide semiconductor stacked film; thus, the influence of oxygen vacancies can be reduced.

The material of the second oxide semiconductor layer having a crystal structure is selected as appropriate so that the conduction band forms a well-shaped structure (also referred to as well structure). An example of the well-shaped structure is illustrated in FIG. 3B.

If a Group 14 element such as silicon or carbon serving as an impurity is included in the oxide semiconductor layer, it can work as a donor and form an n-type region. For this reason, the concentration of silicon in each oxide semiconductor layer is controlled to be lower than or equal to $3 \times 10^{18}/cm^3$, preferably lower than or equal to $3 \times 10^{17}/cm^3$. In addition, the concentration of carbon in each oxide semiconductor layer is controlled to be lower than or equal to $3 \times 10^{18}/cm^3$, preferably lower than or equal to $3 \times 10^{17}/cm^3$. In particular, a structure of providing the second oxide semiconductor layer serving as a carrier path between the first oxide semiconductor layer and the third oxide semiconductor layer or surrounding the second oxide semiconductor layer with the first oxide semiconductor layer and the third oxide semiconductor layer is preferable in order to prevent entry of a large amount of a Group 14 element to the second oxide semiconductor layer. That is, the first oxide semiconductor layer and the third oxide semiconductor layer can be referred to as barrier layers which prevent entry of a Group 14 element such as silicon to the second oxide semiconductor layer.

Further, if hydrogen or moisture serving as an impurity is included in the oxide semiconductor stacked film, it can work as a donor and form an n-type region. Therefore, in order to achieve a well-shaped structure, it is useful to provide a protective film (e.g., a silicon nitride film) which prevents entry of hydrogen or moisture from the outside over or below the oxide semiconductor stacked film.

Each of the oxide semiconductor layers in the stacked structure includes at least indium (In) and is formed using a sputtering target that can be used for deposition by an AC sputtering method or a DC sputtering method. In the case where indium is contained in the sputtering target, conductivity can be increased. Thus, usage of indium in the sputtering target facilitates deposition by an AC sputtering method or a DC sputtering method. Materials of the first oxide semiconductor layer and the third oxide semiconductor layer can be represented as $InM1_xZn_yO_z$ (X≥1, Y>1, Z>0, M1=Ga, Hf, or the like). Each oxide semiconductor layer in the stacked structure may include Ga. However, a material with a high proportion of Ga, specifically the material represented as $InM1_xZn_yO_z$ with X exceeding 10, is not suitable because powder may be generated in the deposition and deposition by an AC sputtering method or a DC sputtering method may become difficult.

The material of the second oxide semiconductor layer can be represented as $InM2_xZn_yO_z$ (X≥1, Y≥X, Z>0, M2=Ga, Sn, or the like).

The materials of the first, second, and third oxide semiconductor layers are selected as appropriate so that the conduction band forms such a well-shaped structure that the bottom of the conduction band in the second oxide semiconductor layer is deeper and farther from the vacuum level than the bottom of the conduction band in the first oxide semiconductor layer and the bottom of the conduction band in the third oxide semiconductor layer.

Since the second oxide semiconductor layer having a crystal structure is stacked over the first oxide semiconductor layer having an amorphous structure, it can be said that the first oxide semiconductor layer and the second oxide semiconductor layer have a hetero structure having different crystal structures. Further, since an oxide semiconductor layer having a crystal structure is stacked over the second oxide semiconductor layer as the third oxide semiconductor layer having a different composition, it can be said that the second oxide semiconductor layer and the third oxide semiconductor layer have a hetero structure having different compositions. Formation of the third oxide semiconductor layer over the second oxide semiconductor layer having a crystal structure allows the third oxide semiconductor layer to have a crystal structure. In this case, a boundary between the second oxide semiconductor layer and the third oxide semiconductor layer cannot be clearly identified by observation of the cross section with a TEM in some cases. However, since the crystallinity of the third oxide semiconductor layer is lower than that of the second oxide semiconductor layer, the boundary can be identified by the degree of crystallinity.

With the above-described stacked structure of the oxide semiconductor stacked film serving as the semiconductor layer of the transistor, the absorption coefficient due to localized states in a region where a channel is formed, which is measured by a constant photocurrent method (CPM), can be lower than or equal to $3 \times 10^{-3}$/cm (lower than or equal to $3 \times 10^{13}$/cm$^3$ in state density).

The above-described stacked structure is a structural example in which one well-shaped structure is formed using the first, second, and third oxide semiconductor layers; however, the present invention is not limited to this structure. A plurality of well-shaped structures may be formed by making the second oxide semiconductor layer have a multi-layer structure.

A semiconductor device according to one embodiment of the present invention includes a transistor including an oxide semiconductor stacked film or a circuit including such a transistor. For example, the semiconductor device indicates an LSI, a CPU, a power device mounted in a power circuit, a semiconductor integrated circuit including a memory, a thyristor, a converter, an image sensor, or the like, an electro-optical device typified by a liquid crystal display panel, a light-emitting display device including a light-emitting element, or an electronic device including the aforementioned device as a component.

With one embodiment of the present invention, a transistor having electrically stable characteristics can be provided. By using the transistor in a semiconductor device, the reliability of the semiconductor device can be increased.

BRIEF DESCRIPTION OF DRAWINGS

In the accompanying drawings:

FIGS. 10A and 10B each illustrate one embodiment of a semiconductor device;

FIG. 17 shows results of TOF-SIMS analysis;

BEST MODE FOR CARRYING OUT THE INVENTION

Hereinafter, embodiments of the invention disclosed in this specification and the like will be described in detail with reference to the accompanying drawings. However, the invention disclosed in this specification and the like is not limited to the description below, and it is easily understood by those skilled in the art that modes and details disclosed herein can be modified in various ways. Therefore, the invention disclosed in this specification and the like is not construed as being limited to the description of the following embodiments. Note that the ordinal numbers such as "first" and "second" are used for convenience and do not denote the order of steps or the stacking order of layers. In addition, the ordinal numbers in this specification do not denote particular names which specify the present invention.

(Embodiment 1)

In this embodiment, a mode of a semiconductor device according to one embodiment of the present invention will be described with reference to FIGS. 1A to 1C, FIGS. 2A and 2B, FIGS. 3A to 3C, and FIGS. 4A to 4D.

There is no particular limitation on the structure of a transistor that is provided in the semiconductor device according to one embodiment of the present invention; for example, a staggered type or a planar type having a top-gate structure or a bottom-gate structure can be employed. Further, the transistor may have a single gate structure including one channel formation region, or a multi-gate structure such as a double gate structure including two channel formation regions or a triple gate structure including three channel formation regions. Further, the transistor may have a dual-gate structure including two gate electrode layers positioned above and below a channel formation region with gate insulating films interposed therebetween.

Figure 1A:
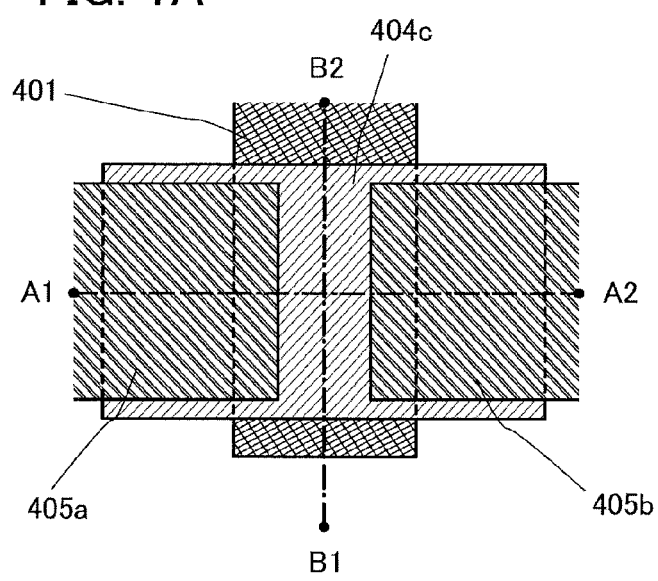
FIG. 1A is a plan view of a semiconductor device and FIGS. 1B and 1C are cross-sectional views of the semiconductor device.
Figure 1C:
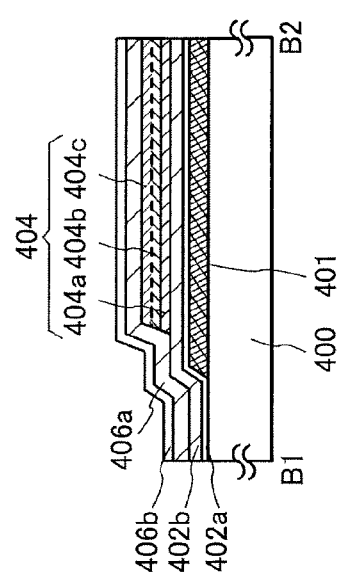
Figure 1B:
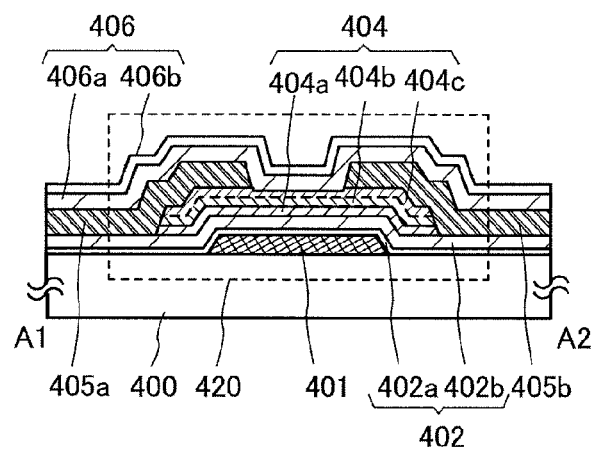

FIGS. 1A to 1C illustrate an example of the structure of a transistor 420 having a bottom gate structure. FIG. 1A is a plan view of the transistor 420. FIG. 1B is a cross-sectional view taken along dashed-dotted line A1-A2 in FIG. 1A. FIG. 1C is a cross-sectional view taken along dashed-dotted line B1-B2 in FIG. 1A.

The transistor 420 includes a gate electrode layer 401 provided over a substrate 400 having an insulating surface, a gate insulating film 402 provided over the gate electrode layer 401, an oxide semiconductor stacked film 404 overlapping with the gate electrode layer 401 with the gate insulating film 402 provided therebetween, and a source electrode layer 405a and a drain electrode layer 405b provided in contact with the oxide semiconductor stacked film 404. An insulating film 406 is provided so as to cover the source electrode layer 405a and the drain electrode layer 405b and so as to be in contact with the oxide semiconductor stacked film 404.

The oxide semiconductor stacked film 404 includes a plurality of stacked oxide semiconductor layers and, for example, has a structure in which three layers of a first oxide semiconductor layer 404a, a second oxide semiconductor layer 404b, and a third oxide semiconductor layer 404c are sequentially stacked.

The first oxide semiconductor layer 404a, the second oxide semiconductor layer 404b, and the third oxide semiconductor layer 404c include at least indium (In) and are formed using a sputtering target that can be used for deposition by an AC sputtering method or a DC sputtering method. In the case where indium is contained in the sputtering target, conductivity can be increased. Thus, usage of indium in the sputtering target facilitates deposition by an AC sputtering method or a DC sputtering method.

Materials of the first oxide semiconductor layer 404a and the third oxide semiconductor layer 404c can be represented as $InM1_XZn_YO_Z$ ($X \geq 1$, $Y \geq 1$, $Z > 0$, M1=Ga, Hf, or the like). Each oxide semiconductor layer in the oxide semiconductor stacked film 404 may include Ga. However, a material with a high proportion of included Ga, specifically the material represented as $InM1_XZn_YO_Z$ with X exceeding 10, is not suitable because dust may be generated in the deposition and deposition by an AC sputtering method or a DC sputtering method may become difficult.

A material of the second oxide semiconductor layer 404b can be represented as $InM2_XZn_YO_Z$ ($X \geq 1$, $Y \geq X$, $Z > 0$, M2=Ga, Sn, or the like).

The materials of the first, second, and third oxide semiconductor layers are selected as appropriate so that the conduction band forms such a well-shaped structure that the bottom of the conduction band in the second oxide semiconductor layer 404b is deeper and farther from the vacuum level than the bottom of the conduction band in the first oxide semiconductor layer 404a and the bottom of the conduction band in the third oxide semiconductor layer 404c.

As a metal oxide of an oxide semiconductor has a higher indium content, the metal oxide has higher conductivity. For example, the indium content of the second oxide semiconductor layer 404b is made to be higher than those of the first oxide semiconductor layer 404a and the third oxide semiconductor layer 404c; in such a case, the conductivity $\delta_2$ of the second oxide semiconductor layer 404b can be higher than the conductivity $\delta_1$ of the first oxide semiconductor layer 404a and the conductivity $\delta_3$ of the third oxide semiconductor layer 404c.

The conductivity $\delta_2$ is preferably more than or equal to 1000 times, further preferably more than or equal to 100,000 times as high as the conductivity $\delta_1$ and the conductivity $\delta_3$.

For example, an oxide semiconductor layer with an atomic ratio In:Ga:Zn=1:1:1 has a conductivity of $6.5 \times 10^{-5}$ S/cm to $4.5 \times 10^{-1}$ S/cm. An oxide semiconductor layer with an atomic ratio In:Ga:Zn=3:1:2 has a conductivity of 2.0 S/cm to 9.7 S/cm. Further, an oxide semiconductor layer with an atomic ratio In:Ga:Zn=1:3:2 has a conductivity of $1 \times 10^{-7}$ S/cm (lower than the lower measurement limit).

For example, in the oxide semiconductor stacked film 404, the first oxide semiconductor layer 404a has an atomic ratio In:Ga:Zn=1:3:2, the second oxide semiconductor layer 404b has an atomic ratio In:Ga:Zn=1:1:1, and the third oxide semiconductor layer 404c has an atomic ratio In:Ga:Zn=1:3:2. For example, the first oxide semiconductor layer 404a has an atomic ratio In:Ga:Zn=1:3:2, the second oxide semiconductor layer 404b has an atomic ratio In:Ga:Zn=3:1:2, and the third oxide semiconductor layer 404c has an atomic ratio In:Ga:Zn=1:1:1. Note that the proportion of each atom in the atomic ratio of each oxide semiconductor layer varies within a range of ±20%, or ±10% as an error.

The second oxide semiconductor layer 404b may have a stacked structure including two or more layers.

The first oxide semiconductor layer 404a to the third oxide semiconductor layer 404c each preferably have a thickness of more than or equal to 1 nm and less than or equal to 50 nm, further preferably more than or equal to 5 nm and less than or equal to 20 nm.

If a Group 14 element such as silicon or carbon serving as an impurity is included in the oxide semiconductor layer, it can work as a donor and form an n-type region. For this reason, the concentration of silicon in each oxide semiconductor layer is controlled to be lower than or equal to $3 \times 10^{18}/cm^3$, preferably lower than or equal to $3 \times 10^{17}/cm^3$. In addition, the concentration of carbon in each oxide semiconductor layer is controlled to be lower than or equal to $3 \times 10^{18}/cm^3$, preferably lower than or equal to $3 \times 10^{17}/cm^3$. In particular, a structure of providing the second oxide semiconductor layer 404b serving as a carrier path between the first oxide semiconductor layer 404a and the third oxide semiconductor layer 404c or surrounding the second oxide semiconductor layer 404b with the first oxide semiconductor layer 404a and the third oxide semiconductor layer 404c is preferable in order to prevent entry of a large amount of a Group 14 element to the second oxide semiconductor layer 404b. That is, the first oxide semiconductor layer 404a and the third oxide semiconductor layer 404c can be referred to as barrier layers which prevent entry of a Group 14 element such as silicon to the second oxide semiconductor layer 404b.

A structure that each of the oxide semiconductor layers may have will be described below.

An oxide semiconductor layer is classified roughly into a non-single-crystal oxide semiconductor layer and a single-crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of c-axis aligned crystal parts.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

Most of the crystal parts included in the CAAC-OS layer each fit inside a cube whose one side is less than 100 nm. Thus, there is a case where a crystal part included in the CAAC-OS layer fits a cube whose one side is less than 10 nm, less than 5 nm, or less than 3 nm. Note that when a plurality of crystal parts included in the CAAC-OS layer are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS layer is subjected to structural analysis with an X-ray diffraction (XRD) apparatus. For example, when the CAAC-OS layer including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, distribution of c-axis aligned crystal parts in the CAAC-OS layer is not necessarily uniform. For example, in the case where crystal growth leading to the CAAC-OS layer occurs from the vicinity of the top surface of the layer, the proportion of the c-axis aligned crystal parts in the vicinity of the top surface is higher than that in the vicinity of the formation surface in some cases. Further, when an impurity is added to the CAAC-OS layer, a region to which the impurity is added is altered, and the proportion of the c-axis aligned crystal parts in the CAAC-OS layer varies depending on regions, in some cases.

Note that when the CAAC-OS layer with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appear at around 31° and a peak of 2θ do not appear at around 36°.

The CAAC-OS layer is an oxide semiconductor layer having a low impurity concentration. The impurity is any of elements which are not the main components of the oxide semiconductor layer and includes hydrogen, carbon, silicon, a transition metal element, and the like. In particular, an element (e.g., silicon) which has higher bonding strength with oxygen than a metal element included in the oxide semiconductor layer causes disorder of atomic arrangement in the oxide semiconductor layer because the element deprives the oxide semiconductor layer of oxygen, thereby reducing crystallinity. Further, a heavy metal such as iron or nickel, argon, carbon dioxide, and the like have a large atomic radius (or molecular radius); therefore, when any of such elements is contained in the oxide semiconductor layer, the element causes disorder of the atomic arrangement of the oxide semiconductor layer, thereby reducing crystallinity.

Note that the impurity contained in the oxide semiconductor layer might become a carrier trap or a source of carriers.

The CAAC-OS layer is an oxide semiconductor layer having a low density of defect states. For example, oxygen vacancies in the oxide semiconductor layer serve as carrier traps or serve as carrier generation sources when hydrogen is captured therein.

The state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor layer has few carrier generation sources, and thus has a low carrier density. Thus, a transistor using the oxide semiconductor layer rarely has a negative threshold voltage (rarely has normally-on characteristics). A highly purified intrinsic or substantially highly purified intrinsic oxide semiconductor layer has few carrier traps. Accordingly, the transistor using the oxide semiconductor layer has little variation in electrical characteristics and high reliability. Note that charges trapped by the carrier traps in the oxide semiconductor layer take a long time to be released and may behave like fixed charges. Thus, the transistor using the oxide semiconductor layer with a high impurity concentration and a high density of defect states has unstable electrical characteristics in some cases.

In a transistor using the CAAC-OS layer, change in electrical characteristics due to irradiation with visible light or ultraviolet light is small.

Next, a microcrystalline oxide semiconductor layer will be described.

In an image obtained with a TEM, for example, crystal parts cannot be found clearly in the microcrystalline oxide semiconductor layer in some cases. In most cases, the size of a crystal part included in the microcrystalline oxide semiconductor layer is greater than or equal to 1 nm and less than or equal to 100 nm, or greater than or equal to 1 nm and less than or equal to 10 nm, for example. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In an image of the nc-OS layer obtained with a TEM, for example, a boundary between crystal parts is not clearly detected in some cases.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS layer; thus, the orientation of the whole layer is not observed. Accordingly, in some cases, the nc-OS layer cannot be distinguished from an amorphous oxide semiconductor layer depending on an analysis method. For example, when the nc-OS layer is subjected to structural analysis by an out-of-plane method with an XRD apparatus using an X-ray having a probe diameter larger than that of a crystal part, a peak which shows a crystal plane does not appear. Further, a halo pattern is shown in an electron diffraction pattern (also referred to as a selected-area electron diffraction pattern) of the nc-OS layer obtained by using an electron beam having a probe diameter (e.g., larger than or equal to 50 nm) larger than that of a crystal part. Meanwhile, spots are shown in a nanobeam electron diffraction image of the nc-OS layer obtained by using an electron beam having a probe diameter (e.g., larger than or equal to 1 nm and smaller than or equal to 30 nm) close to, or smaller than or equal to that of a crystal part. Further, in a nanobeam electron diffraction image of the nc-OS layer, regions with high luminance in a circular (ring) pattern are shown in some cases. Also in a nanobeam electron diffraction image of the nc-OS layer, a plurality of spots are shown in a ring-like region in some cases.

Since the nc-OS layer is an oxide semiconductor layer having more regularity than the amorphous oxide semiconductor layer, the nc-OS layer has a lower density of defect states than the amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked film including two or more layers of an amorphous oxide semiconductor layer, a microcrystalline oxide semiconductor layer, and a CAAC-OS layer, for example.

The first oxide semiconductor layer 404a to the third oxide semiconductor layer 404c are each any of an amorphous oxide semiconductor layer, a microcrystalline oxide semiconductor layer, or a CAAC-OS layer, for example.

The first oxide semiconductor layer 404a to the third oxide semiconductor layer 404c may include oxide semiconductors having different crystallinities from one another. In other words, a structure appropriately combining an amorphous oxide semiconductor, a microcrystalline oxide semiconductor, and a CAAC-OS can be employed.

In this embodiment, a case in which an oxide semiconductor having an amorphous structure is used for the first oxide semiconductor layer 404a, a CAAC-OS is used for the second oxide semiconductor layer 404b, and a CAAC-OS is used for the third oxide semiconductor layer 404c is described with reference to FIGS. 1A to 1C.

As illustrated in FIGS. 1B and 1C, the second oxide semiconductor layer 404b having a crystal structure is stacked over the first oxide semiconductor layer 404a having an amorphous structure; in this case, it can be said that the first oxide semiconductor layer 404a and the second oxide semiconductor layer 404b have a hetero structure having different crystal structures. Further, the third oxide semiconductor layer 404c having a different composition is stacked over the second oxide semiconductor layer 404b; in this case, it can be said that the second oxide semiconductor layer 404b and the third oxide semiconductor layer 404c have a hetero structure having different compositions.

Formation of the third oxide semiconductor layer 404c over the second oxide semiconductor layer 404b having a crystal structure allows the third oxide semiconductor layer 404c to have a crystal structure. In this case, a boundary between the second oxide semiconductor layer 404b and the third oxide semiconductor layer 404c cannot be clearly identified by observation of the cross section with a TEM in some cases. However, since the crystallinity of the third oxide semiconductor layer 404c is lower than that of the second oxide semiconductor layer 404b, the boundary can be identified by the degree of crystallinity. In FIGS. 1B and 1C, the boundary between the second oxide semiconductor layer 404b and the third oxide semiconductor layer 404c is indicated by a dotted line. Note that the third oxide semiconductor layer 404c may be the one including a crystal part at an interface with the second oxide semiconductor layer 404b and including an amorphous region on the top surface side.

In an amorphous oxide semiconductor, impurities are easily captured and accordingly, the carrier density is likely to increase; thus, relatively high field-effect mobility can be obtained with relative ease.

The crystallinity of an oxide semiconductor layer can be increased by formation of the oxide semiconductor layer on a flat surface. For example, the oxide semiconductor layer is favorably formed on a surface with an average surface roughness ($R_a$) of 1 nm or less, preferably 0.3 nm or less, further preferably 0.1 nm or less.

Note that $R_a$ is obtained by expanding, into three dimensions, arithmetic mean surface roughness that is defined by JIS B 0601: 2001 (ISO4287:1997) so as to be able to apply it to a curved surface. $R_a$ can be expressed as the "average value of the absolute values of deviations from a reference surface to a designated surface" and is defined by Formula 1.

$$Ra = \frac{1}{S_0} \int_{y_1}^{y_2} \int_{x_1}^{x_2} |f(x, y) - Z_0| dx dy \quad \text{[FORMULA 1]}$$

Here, the designated surface is a surface that is a target of roughness measurement, and is a quadrilateral region specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. In addition, $S_0$ represents the area of a rectangle which is obtained by projecting the designated surface on the xy plane, and $Z_0$ represents the height of the reference surface (the average height of the designated surface). Further, Ra can be measured with an atomic force microscope (AFM).

The gate insulating film 402 is formed using a silicon oxide film, a silicon oxynitride film, a silicon nitride oxide film, a silicon nitride film, a gallium oxide film, an aluminum oxide film, a silicon nitride film, or an aluminum oxynitride film. In the case where the gate insulating film 402 has a single-layer structure, a silicon oxide film or a silicon oxynitride film is used, for example. In the case where the gate insulating film 402 has a two-layer structure as illustrated in FIG. 1B, a gate insulating film 402a is, for example, a silicon oxide film or a silicon oxynitride film, and a gate insulating film 402b is, for example, a silicon nitride film.

The insulating film 406 is formed using a silicon oxide film, a silicon oxynitride film, a silicon nitride oxide film, a silicon nitride film, a gallium oxide film, an aluminum oxide film, a silicon nitride film, or an aluminum oxynitride film. In the case where the insulating film 406 has a single-layer structure, a silicon oxynitride film is used, for example. In the case where the insulating film 406 has a two-layer structure as illustrated in FIG. 1B, an insulating film 406a is, for example, a silicon oxide film or a silicon oxynitride film, and an insulating film 406b is, for example, a silicon nitride film.

Here, effects of the oxide semiconductor stacked film which is one embodiment of the present invention will be described with reference to FIGS. 2A and 2B and FIGS. 3A to 3C.

Figure 2A:
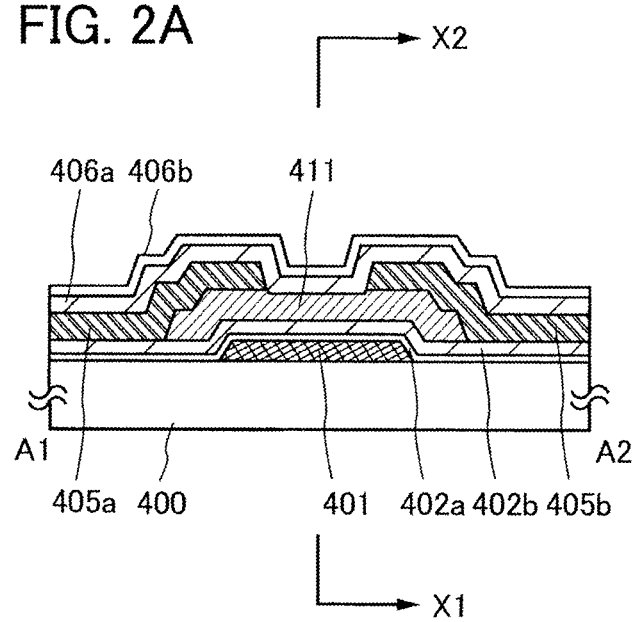
FIG. 2A is a cross-sectional view of a transistor including an oxide semiconductor layer with a single-layer structure.
Figure 2B:
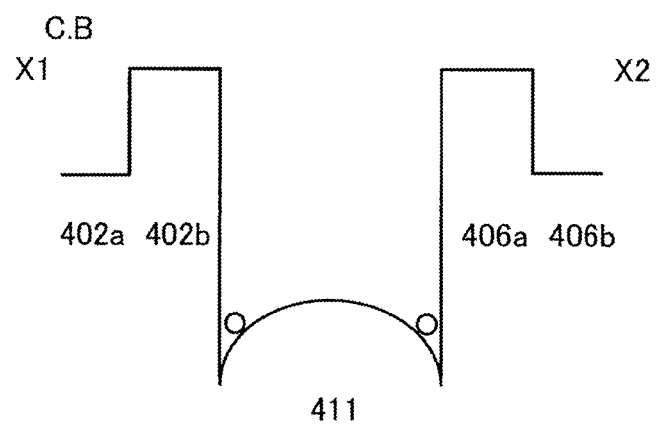
FIG. 2B is an energy band diagram.

FIG. 2A is a cross-sectional view of a transistor using an oxide semiconductor layer having a single-layer structure. FIG. 2B is an energy band diagram (schematic diagram) of a cross section X1-X2 in FIG. 2A.

The transistor illustrated in FIG. 2A includes a gate electrode layer 401 over a substrate 400 having an insulating surface, a gate insulating film provided over the gate electrode layer 401, an oxide semiconductor layer 411 overlapping with the gate electrode layer 401 with the gate insulating film provided therebetween, and a source electrode layer 405a and a drain electrode layer 405b provided in contact with the oxide semiconductor layer 411. An insulating film is provided so as to cover the source electrode layer 405a and the drain electrode layer 405b and so as to be in contact with the oxide semiconductor layer 411.

In FIG. 2A, the oxide semiconductor layer 411 includes an In—Ga—Zn-based oxide (hereinafter abbreviated as IGZO), the gate insulating film has a stacked structure of a gate insulating film 402a and a gate insulating film 402b, and the insulating film has a stacked structure of an insulating film 406a and an insulating film 406b. The following description is given on the assumptions that the gate insulating film 402a and the insulating film 406b are silicon nitride films and the gate insulating film 402b and the insulating film 406b are silicon oxynitride films.

Figure 3A:
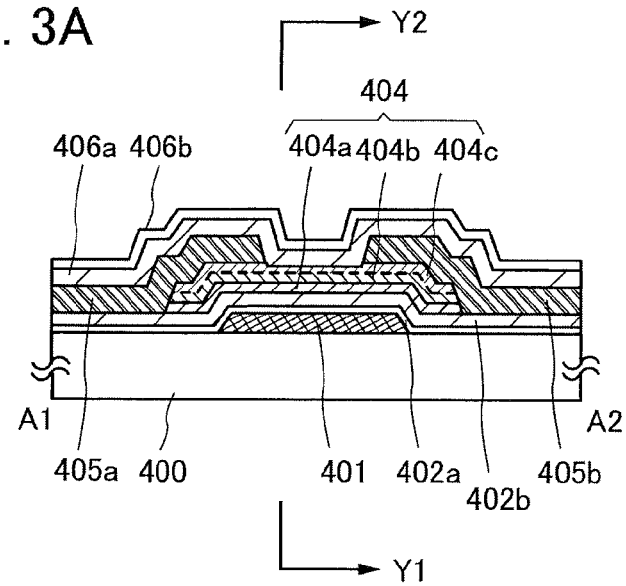
FIG. 3A is a cross-sectional view of a transistor including an oxide semiconductor layer with a three-layer structure.
Figure 3B:
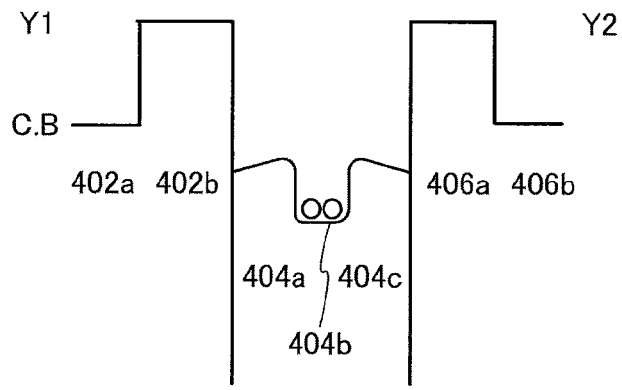
FIGS. 3B and 3C show energy band diagrams.
Figure 3C:
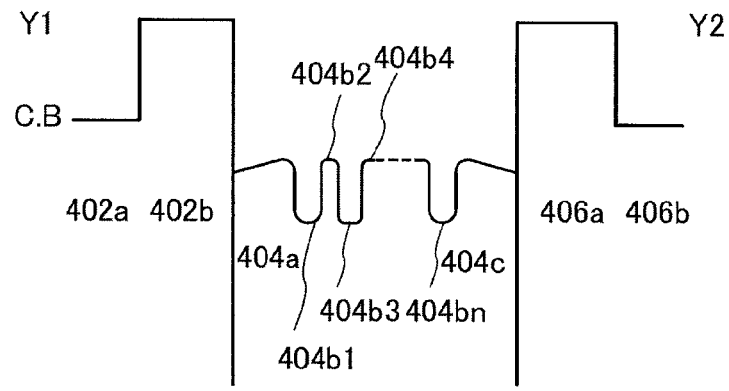

FIG. 3A is a cross-sectional view of the transistor using the oxide semiconductor layer having a stacked structure (oxide semiconductor stacked film), and FIG. 3B is an energy band diagram of a cross section Y1-Y2 in FIG. 3A. FIG. 3C is an energy band diagram (the cross-sectional view of the corresponding transistor is not given) in the case where the second oxide semiconductor layer 404b in the oxide semiconductor stacked film 404 has a stacked structure including n layers.

In the oxide semiconductor stacked film 404 illustrated in FIG. 3A, the first oxide semiconductor layer 404a and the third oxide semiconductor layer 404c are IGZO layers formed using a target having an atomic ratio In:Ga:Zn=1:3:2, and the second oxide semiconductor layer 404b is an IGZO layer formed using a target having an atomic ratio In:Ga:Zn=1:1:1. Further, the gate insulating film 402 has a stacked structure of the gate insulating film 402a and the gate insulating film 402b. The insulating film 406 has a stacked structure of the insulating film 406a and the insulating film 406b. The following description is given on the assumptions that the gate insulating film 402a and the insulating film 406b are silicon nitride films and the gate insulating film 402b and the insulating film 406b are silicon oxynitride films.

In a transistor including an oxide semiconductor, oxygen vacancies in the oxide semiconductor cause the transistor to have poor electrical characteristics. Therefore, it is necessary to reduce oxygen vacancies in the oxide semiconductor. The oxygen vacancies in the oxide semiconductor can be reduced, for example, by a step of introducing oxygen into an oxide semiconductor layer or the supply of oxygen from an insulating film that is in contact with the oxide semiconductor layer.

However, in the case where the insulating film that is in contact with the oxide semiconductor layer includes an element (e.g., in the case where the insulating film is a silicon oxide film or a silicon oxynitride film) that is different from the constituent elements of the oxide semiconductor layer, oxygen vacancies are likely to be generated at an interface between the oxide semiconductor layer and the insulating film. The oxygen vacancies generated by the contact between the oxide semiconductor layer and the insulating film is hard to reduce by the above-mentioned treatments.

The oxygen vacancies in the oxide semiconductor layer are clearly visible as localized states in deep energy area in the energy gap of the oxide semiconductor.

In the case where the oxide semiconductor layer has a single-layer structure as illustrated in FIG. 2A, oxygen vacancies are likely to be generated at the interface with the gate insulating film 402b or the interface with the insulating film 406a in the oxide semiconductor layer 411. On application of a voltage to the gate electrode layer 401, electrons move in the vicinity of the interface between the gate insulating film 402b and the oxide semiconductor layer 411. At this time, if localized states due to oxygen vacancies exist in the vicinity of the interface between the gate insulating film 402b and the oxide semiconductor layer 411, carriers are trapped by the localized states, which varies electrical characteristics of the transistor and lowers the reliability of the transistor.

Since the gate insulating film 402b and the insulating film 406a include silicon, silicon may enter a region that is about several nanometers from the surface of the oxide semiconductor layer 411. Silicon that enters IGZO forms impurity states. The impurity states serve as donors and may donate electrons and form an n-type region. Thus, the band of the oxide semiconductor layer 411 is bent like as illustrated in FIG. 2B. By the entry of silicon into the oxide semiconductor layer 411, the oxide semiconductor layer 411 is likely to become amorphous.

In the transistor using the oxide semiconductor layer 411, a reduction in field effect mobility by interface scattering and scattering of an impurity such as silicon is a concern.

In consideration of this concern, the oxide semiconductor stacked film 404 having a three-layer structure of oxide semiconductor layers as illustrated in FIG. 3A is employed. For example, the first oxide semiconductor layer 404a and the third oxide semiconductor layer 404c which are the IGZO layers having an atomic ratio In:Ga:Zn=1:3:2 have smaller electron affinities than the second oxide semiconductor layer 404b which is the IGZO layer having an atomic ratio In:Ga:Zn=1:1:1. Thus, the conduction band of the oxide semiconductor stacked film 404 has a well-shaped structure as illustrated in FIG. 3B, which allows the second oxide semiconductor layer 404b serve as a path of electrons.

With the above-described stacked structure of the oxide semiconductor stacked film 404, when a voltage is applied to the gate electrode layer 401, electrons move not in the vicinity of the interface between the gate insulating film 402b and the first oxide semiconductor layer 404a but in the vicinity of the interface between the first oxide semiconductor layer 404a and the second oxide semiconductor layer 404b. The first oxide semiconductor layer 404a and the second oxide semiconductor layer 404b are oxide semiconductor layers including the same constituent elements but with different atomic ratios. Thus, the amount of oxygen vacancies formed in the vicinity of the interface with the first oxide semiconductor layer 404a in the second oxide semiconductor layer 404b can be smaller than the amount of oxygen vacancies formed in the vicinity of the interface with the gate insulating film 402b in the first oxide semiconductor layer 404a. Accordingly, even when electrons move in the vicinity of the interface between the first oxide semiconductor layer 404a and the second oxide semiconductor layer 404b, the influence of localized states due to oxygen vacancies can be small. This can suppress variation in electrical characteristics of the transistor, and a highly reliable transistor can be provided.

Further, even when entry of silicon to the oxide semiconductor stacked film 404 arises, if the thickness of each of the first oxide semiconductor layer 404a and the third oxide semiconductor layer 404c is larger than several nanometers, to which the entry of silicon can occur, silicon can be prevented from reaching the second oxide semiconductor layer 404b. Thus, the first oxide semiconductor layer 404a and the third oxide semiconductor layer 404c can be regarded as barrier layers which prevent entry of a Group 14 element such as silicon to the second oxide semiconductor layer 404b. In addition, since electrons move in the second oxide semiconductor layer 404b, impurity scattering is unlikely to occur as compared to the case where electrons move in the first oxide semiconductor layer 404a or the third oxide semiconductor layer 404c.

Since the second oxide semiconductor layer 404b includes no silicon or a small amount of silicon, in the case where CAAC-OS is used in the second oxide semiconductor layer 404b, the proportion of crystal parts therein can be increased.

Thus, since interface scattering and scattering of an impurity such as silicon little occur in the transistor including the oxide semiconductor stacked film 404, field effect mobility can be increased.

A structural example for forming one well-shaped structure using the first, second, and third oxide semiconductor layers is illustrated in FIGS. 3A and 3B; however, a plurality of well-shaped structures may be formed by making the second oxide semiconductor layer have a multi-layer structure. An example of this structure is illustrated in FIG. 3C.

In the case where the second oxide semiconductor layer includes n layers, the materials of the first, second, and third oxide semiconductor layers are selected as appropriate so that the conduction band forms such a well-shaped structure that the bottom of the conduction band in the odd-numbered layers in the n layers of the second oxide semiconductor layer, e.g., second oxide semiconductor layers 404b1, 404b3, 404bn, are deeper and farther from the vacuum level than the bottom of the conduction band in the first oxide semiconductor layer 404a and the bottom of the conduction band in the third oxide semiconductor layer 404c.

Note that defects (oxygen vacancies) of the oxide semiconductor can be evaluated by a constant photocurrent method (CPM), for example. In CPM measurement, the amount of light with which a surface of a sample between terminals is irradiated is adjusted in the state where voltage is applied between two electrodes included in the sample so that a photocurrent value is kept constant, and then an absorption coefficient is derived from the amount of the irradiation light in each wavelength. In the CPM measurement, when the sample has a defect, the absorption coefficient due to the energy which corresponds to the level at which the defect exists (calculated from the wavelength) is increased. The increase in the absorption coefficient is multiplied by a constant, whereby the density of states (hereinafter also referred to as DOS) of the sample can be obtained.

With the above-described stacked structure of the oxide semiconductor layers serving as the semiconductor layer of the transistor, the absorption coefficient due to localized states in a region where a channel is formed, which is measured by a constant photocurrent method (CPM), can be lower than or equal to $3 \times 10^{-3}$/cm (lower than or equal to $3 \times 10^{13}$/cm$^3$ in state density).

In the oxide semiconductor stacked film 404, if the thickness of the first oxide semiconductor layer 404a on the gate electrode layer 401 side is too large, by application of a voltage to the gate electrode layer 401, electrons move not in the vicinity of the interface between the first oxide semiconductor layer 404a and the second oxide semiconductor layer 404b but in the first oxide semiconductor layer 404a. Accordingly, it is preferable that the first to third oxide semiconductor layers 404a to 404c each have a thickness of more than or equal to 1 nm and less than or equal to 50 nm, further preferably more than or equal to 5 nm and less than or equal to 20 nm.

Figure 4A:
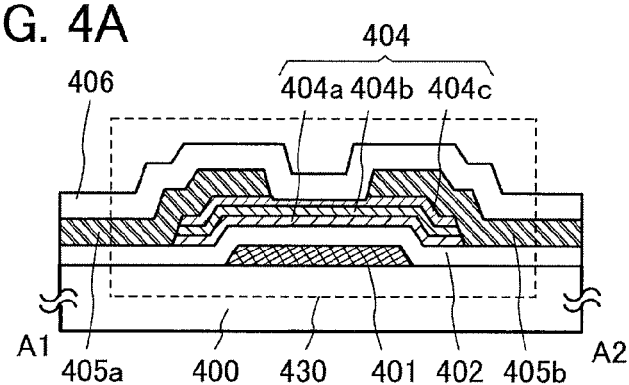
FIGS. 4A to 4D are cross-sectional views of semiconductor devices.

FIG. 4A illustrates a transistor 430 including the oxide semiconductor stacked film 404 in which an oxide semiconductor having an amorphous structure is used as the first oxide semiconductor layer 404a, a CAAC-OS is used as the second oxide semiconductor layer 404b, and an oxide semiconductor having an amorphous structure is used as the third oxide semiconductor layer 404c. Note that the structures other than the oxide semiconductor stacked film 404 are similar to those in the transistor 420 illustrated in FIGS. 1A to 1C.

Figure 4B:
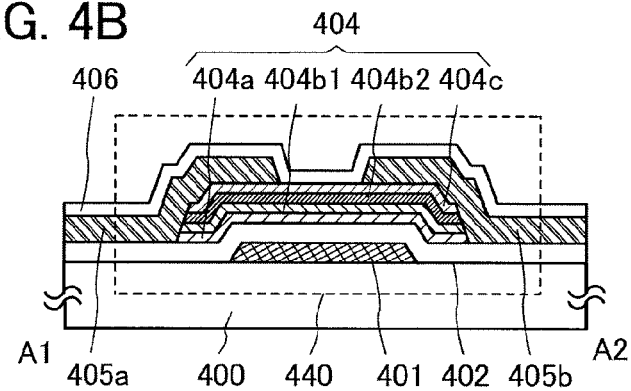

Further, FIG. 4B illustrates a transistor 440 including the oxide semiconductor stacked film 404 in which the second oxide semiconductor layer has a two-layer structure. Note that the structures other than the oxide semiconductor stacked film 404 are similar to those in the transistor 420 illustrated in FIGS. 1A to 1C.

In the case where the second oxide semiconductor layer 404b has a two-layer structure, the atomic ratio of the first oxide semiconductor layer 404a is preferably for example In:Ga:Zn=1:3:2, the atomic ratio of the oxide semiconductor layer 404b1 corresponding to the second oxide semiconductor layer 404b is preferably for example In:Ga:Zn=3:1:2, the atomic ratio of the oxide semiconductor layer 404b2 is preferably for example In:Ga:Zn=1:1:1, and the atomic ratio of the third oxide semiconductor layer 404c is preferably for example In:Ga:Zn=1:3:2. Note that the proportion of each atom in the atomic ratio of each oxide semiconductor layer varies within a range of ±20%, or ±10% of the atomic ratio as an error.

Figure 4C:
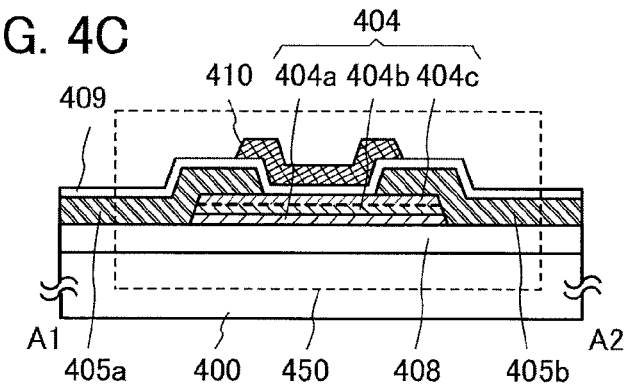

FIG. 4C illustrates a transistor 450 having a top gate structure.

The transistor 450 includes an insulating film 408 provided over the substrate 400 having an insulating surface, the oxide semiconductor stacked film 404 provided over the insulating film 408, the source electrode layer 405a and the drain electrode layer 405b provided in contact with the oxide semiconductor stacked film 404, a gate insulating film 409 provided over the oxide semiconductor stacked film 404, the source electrode layer 405a, and the drain electrode layer 405b, and a gate electrode layer 410 overlapping with the oxide semiconductor stacked film 404 with the gate insulating film 409 provided therebetween.

As an example, the case in which the oxide semiconductor stacked film includes an amorphous oxide semiconductor as the first oxide semiconductor layer 404a, a CAAC-OS as the second oxide semiconductor layer 404b, and a CAAC-OS as the third oxide semiconductor layer 404c, is described. Note that the third oxide semiconductor layer 404c may be an oxide semiconductor having an amorphous structure.

With the above-described stacked structure of the oxide semiconductor stacked film 404, when a voltage is applied to the gate electrode layer 410, carriers move not in the vicinity of the interface between the gate insulating film 409 and the third oxide semiconductor layer 404c but in the vicinity of the interface between the third oxide semiconductor layer 404c and the second oxide semiconductor layer 404b. The second oxide semiconductor layer 404b and the third oxide semiconductor layer 404c are oxide semiconductor layers including the same constituent elements but with different atomic ratios. Thus, the amount of oxygen vacancies formed in the vicinity of the interface with the third oxide semiconductor layer 404c in the second oxide semiconductor layer 404b can be smaller than the amount of oxygen vacancies formed in the vicinity of the interface with the gate insulating film 409 in the third oxide semiconductor layer 404c.

Further, the third oxide semiconductor layer 404c is a film formed by crystal growth using a crystal part included in the second oxide semiconductor layer 404b as a seed crystal. This can further reduce the amount of oxygen vacancies formed in the vicinity of the interface with the third oxide semiconductor layer 404c in the second oxide semiconductor layer 404b.

Accordingly, even when carriers move in the vicinity of the interface between the third oxide semiconductor layer 404c and the second oxide semiconductor layer 404b, the influence of localized states due to oxygen vacancies can be small. This can suppress variation in electrical characteristics of the transistor, and a highly reliable transistor can be provided.

If the thickness of the third oxide semiconductor layer 404c on the gate electrode layer 410 side is too large, by application of a voltage to the gate electrode layer 410, carriers move not in the vicinity of the interface between the third oxide semiconductor layer 404c and the second oxide semiconductor layer 404b but in the third oxide semiconductor layer 404c. Accordingly, it is preferable that the first to third oxide semiconductor layers 404a to 404c each have a thickness of more than or equal to 1 nm and less than or equal to 50 nm, further preferably more than or equal to 5 nm and less than or equal to 20 nm.

Figure 4D:
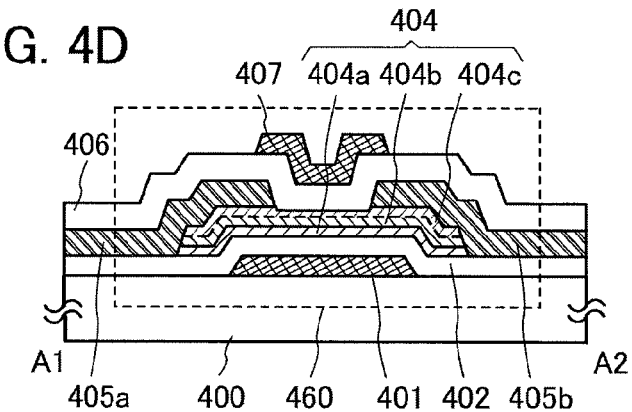

FIG. 4D illustrates a dual-gate transistor 460 including two gate electrode layers positioned above and below a channel formation region with a gate insulating film provided therebetween.

The transistor 460 includes the gate electrode layer 401 provided over the substrate 400 having an insulating surface, the gate insulating film 402 provided over the gate electrode layer 401, the oxide semiconductor stacked film 404 overlapping with the gate electrode layer 401 with the gate insulating film 402 provided therebetween, the source electrode layer 405a and the drain electrode layer 405b provided in contact with the oxide semiconductor stacked film 404, the insulating film 406 provided so as to cover the source electrode layer 405a and the drain electrode layer 405b and so as to be in contact with the oxide semiconductor stacked film 404, and an electrode layer 407 overlapping with the oxide semiconductor stacked film 404 with the insulating film 406 provided therebetween.

The case in which the oxide semiconductor stacked film 404 includes an oxide semiconductor having an amorphous structure as the first oxide semiconductor layer 404a, a CAAC-OS as the second oxide semiconductor layer 404b, and a CAAC-OS as the third oxide semiconductor layer 404c, is described. Note that the third oxide semiconductor layer 404c may be an oxide semiconductor having an amorphous structure.

In the transistor 460, the insulating film 406 functions as a gate insulating film, and the electrode layer 407 functions as a gate electrode layer. A signal for controlling on/off state of the transistor is supplied to one of the pair of gate electrode layers. The other gate electrode layer may be either in a floating state (electrically insulated state) or a state in which a potential is supplied from another element. In the latter state, potentials with the same level may be supplied to both of the gate electrode layers, or a fixed potential such as a ground potential may be supplied only to the other of the gate electrode layers. By controlling the level of the potential applied to the other of the gate electrode layers, the threshold voltage of the transistor 460 can be controlled. In the above-described manner, by controlling the potentials of the both gate electrode layers, variation in the threshold voltage of the transistor can be further reduced, which can increase reliability.

As described above, the transistor of one embodiment of the present invention has electrically stable characteristics. Therefore, by using the transistor in a semiconductor device, the reliability of the semiconductor device can be increased.

The structures, methods, and the like described in this embodiment can be combined as appropriate with any of the structures, methods, and the like described in the other embodiments.

(Embodiment 2)

In this embodiment, a method for manufacturing the transistor including the oxide semiconductor stacked film illustrated in FIGS. 1A to 1C will be described with reference to FIGS. 5A to 5E.

Figure 5A:
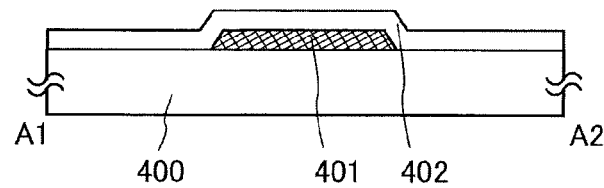
FIGS. 5A to 5E are cross-sectional views illustrating a method for manufacturing a semiconductor device.

First, the gate electrode layer 401 is formed over the substrate 400 (see FIG. 5A).

There is no particular limitation on the substrate that can be used as the substrate 400 having an insulating surface as long as it has at least heat resistance to withstand heat treatment performed later. For example, a variety of glass substrates for electronics industry, such as a barium borosilicate glass substrate or an aluminoborosilicate glass substrate can be used. Note that as the substrate, a substrate having a thermal expansion coefficient of greater than or equal to $25 \times 10^{-7}/°$ C. and less than or equal to $50 \times 10^{-7}/°$ C. (preferably greater than or equal to $30 \times 10^{-7}/°$ C. and less than or equal to $40 \times 10^{-7}/°$ C.) and a strain point of higher than or equal to 650° C. and lower than or equal to 750° C. (preferably higher than or equal to 700° C. and lower than or equal to 740° C.) is preferably used.

In the case where a large-sized substrate having the size of the fifth generation (1000 mm×1200 mm or 1300 mm×1700 mm), the sixth generation (1700 mm×1800 mm), the seventh generation (1870 mm×2200 mm), the eighth generation (2200 mm×2700 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, when such a large-sized glass substrate is used as the substrate, the one with a small shrinkage is preferably used. For example, as the substrate, a large-sized glass substrate whose shrinkage by heat treatment for one hour at preferably 450° C., further preferably 700° C. is less than or equal to 20 ppm, preferably less than or equal to 10 ppm, further preferably less than or equal to 5 ppm may be used.

For example, a ceramic substrate, a quartz substrate, a sapphire substrate, or the like can be used as the substrate 400. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Alternatively, any of these substrates over which a semiconductor element is provided may be used.

The semiconductor device may be manufactured using a flexible substrate as the substrate 400. To manufacture a flexible semiconductor device, the transistor 420 including the oxide semiconductor stacked film 404 may be directly formed over a flexible substrate; or alternatively, the transistor 420 including the oxide semiconductor stacked film 404 may be formed over another manufacturing substrate, and then the transistor may be separated from the manufacturing substrate and transferred to a flexible substrate. Note that, in order to separate the transistor from the manufacturing substrate and transfer it to the flexible substrate, a separation layer may be provided between the manufacturing substrate and the transistor 420 including the oxide semiconductor stacked film.

The gate electrode layer 401 can be formed with the use of a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. The gate electrode layer 401 can have a stacked structure of the above conductive material and the above metal material.

As the gate electrode layer 401, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used.

The gate insulating film 402 can be formed by a sputtering method or a CVD method using a deposition gas. As the CVD method, an LPCVD method, a plasma CVD method, or the like can be used, and as another method, a coating film or the like can also be used.

The gate insulating film 402 can be formed using a silicon oxide film, a silicon oxynitride film, a silicon nitride oxide film, a silicon nitride film, a gallium oxide film, an aluminum oxide film, a silicon nitride film, or an aluminum oxynitride film.

When the gate insulating film 402 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, gate leakage current can be reduced. Further, the gate insulating film 402 has either a single-layer structure or a stacked structure.

Note that a region which is included in the gate insulating film 402 and is in contact with a first oxide semiconductor layer 403a formed later (in this embodiment, the region is the gate insulating film) is preferably an oxide insulating layer and preferably includes a region containing oxygen in excess of the stoichiometric composition (i.e., oxygen-excess region). In order to provide the oxygen-excess region in the gate insulating film 402, for example, the gate insulating film 402 may be formed in an oxygen atmosphere. Alternatively, oxygen may be introduced into the formed gate insulating film 402 to provide the oxygen-excess region. As a method for introducing oxygen, an ion implantation method, an ion doping method, a plasma immersion ion implantation method, plasma treatment, or the like may be employed.

By providing the oxygen-excess region in the gate insulating film 402, oxygen can be supplied to the oxide semiconductor stacked film by performing heat treatment after the formation of the oxide semiconductor stacked film. Thus, oxygen vacancies contained in the oxide semiconductor stacked film can be reduced.

In this embodiment, as the gate insulating film 402, a silicon nitride film and a silicon oxide film are formed.

Figure 5B:
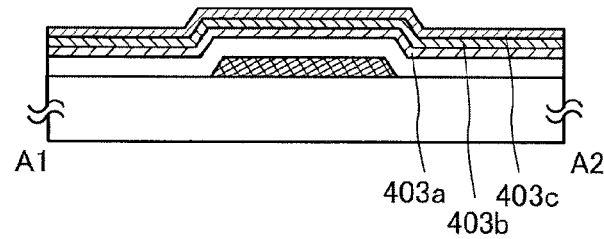

Next, the first oxide semiconductor layer 403a, a second oxide semiconductor layer 403b, and a third oxide semiconductor layer 403c for forming the oxide semiconductor stacked film are sequentially formed over the gate insulating film 402 (see FIG. 5B).

As the first oxide semiconductor layer 403a, the second oxide semiconductor layer 403b, and the third oxide semiconductor layer 403c for forming the oxide semiconductor stacked film, any of the following can be used, for example: an In—Ga—Zn-based oxide (abbreviated as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain a metal element other than In, Ga, and Zn.

Alternatively, a material represented as $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented as $In_2SnO_5(ZnO)_n$ (n>0, n is an integer) may be used.

For example, an In—Ga—Zn-based oxide having an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), In:Ga:Zn=1:3:2 (=1/6:1/2:1/3), or an oxide having an atomic ratio close to the above atomic ratios can be used. Alternatively, an In—Sn—Zn-based oxide having an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide having an atomic ratio close to the above atomic ratios may be used.

However, an oxide semiconductor containing indium is not limited to the materials given above; a material with an appropriate composition may be used depending on required electrical characteristics of the transistor (e.g., field-effect mobility, threshold voltage, and variation). In order to obtain the required electrical characteristics of the transistor, it is preferable that the carrier concentration, the impurity concentration, the defect density, the atomic ratio between a metal element and oxygen, the interatomic distance, the density, and the like be set to appropriate values.

In this embodiment, the case where an IGZO layer having an atomic ratio of In:Ga:Zn=1:3:2 is used as the first oxide semiconductor layer 403a, an IGZO layer having an atomic ratio of In:Ga:Zn=1:1:1 is used as the second oxide semiconductor layer 403b, and an IGZO layer having an atomic ratio of In:Ga:Zn=1:3:2 is used as the third oxide semiconductor layer 403c is described.

The second oxide semiconductor layer 403b and the third oxide semiconductor layer 403c in the transistor 420 are formed of a CAAC-OS including a crystal part. However, the formed second oxide semiconductor layer 403b and the third oxide semiconductor layer 403c do not necessarily include a crystal part, and in this case, the second oxide semiconductor layer 403b including a crystal part and the third oxide semiconductor layer 403c including a crystal part may be obtained by performing heat treatment on the amorphous oxide semiconductor in any of the steps after the formation of the oxide semiconductor layers. The heat treatment for crystallizing the amorphous oxide semiconductor is performed at a temperature higher than or equal to 250° C. and lower than or equal to 700° C., preferably higher than or equal to 400° C., further preferably higher than or equal to 550° C. The heat treatment can also serve as another heat treatment in the manufacturing process. A laser irradiation apparatus may be used for the heat treatment for crystallization.

The oxide semiconductor layers can each be formed by a sputtering method, a molecular beam epitaxy (MBE) method, a CVD method, a pulse laser deposition method, an atomic layer deposition (ALD) method, or the like as appropriate.

In the formation of the oxide semiconductor layers 403a to 403c, the concentration of hydrogen therein is preferably reduced as much as possible. In order to reduce the hydrogen concentration, for example, in the case where a sputtering method is used for the deposition, a high-purity rare gas (typically, argon) from which impurities such as hydrogen, water, a hydroxyl group, or a hydride have been removed; oxygen; or a mixed gas of oxygen and the rare gas is used as appropriate as an atmosphere gas supplied to a deposition chamber of a sputtering apparatus.

The oxide semiconductor layer is formed in such a manner that a sputtering gas from which hydrogen and moisture are removed is introduced into a deposition chamber while moisture remaining in the deposition chamber is removed, whereby the concentration of hydrogen in the deposited oxide semiconductor layer can be reduced. In order to remove the residual moisture in the deposition chamber, an entrapment vacuum pump, for example, a cryopump, an ion pump, or a titanium sublimation pump is preferably used. The evacuation unit may be a turbo molecular pump provided with a cold trap. A cryopump has a high capability in removing a hydrogen molecule, a compound containing a hydrogen atom such as water ($H_2O$) (preferably, also a compound containing a carbon atom), and the like; thus, the impurity concentration in the film formed in the deposition chamber which is evacuated with the cryopump can be reduced.

Further, in the case where the oxide semiconductor layers 403a to 403c are formed by a sputtering method, the relative density (the fill rate) of a metal oxide target which is used for forming the oxide semiconductor layers is greater than or equal to 90% and less than or equal to 100%, preferably greater than or equal to 95% and less than or equal to 99.9%. With the use of the metal oxide target having high relative density, a dense film can be formed.

Note that formation of the oxide semiconductor layer while the substrate 400 is kept at high temperatures is also effective in reducing the impurity concentration in the oxide semiconductor layer. The heating temperature of the substrate 400 may be higher than or equal to 150° C. and lower than or equal to 450° C.; the substrate temperature is preferably higher than or equal to 200° C. and lower than or equal to 400° C. In the case of forming an oxide semiconductor layer having an amorphous structure, the oxide semiconductor layer is preferably formed at a temperature higher than or equal to 25° C. and lower than or equal to 200° C. In the case of forming an oxide semiconductor layer having a crystal structure, the oxide semiconductor layer is preferably formed at a temperature higher than or equal to 200° C. and lower than or equal to 500° C. An oxide semiconductor layer including a crystal part can easily be formed by heating the substrate at high temperature during the film formation.

The CAAC-OS layer is formed, for example, by a sputtering method using a polycrystalline oxide sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In this case, the flat-plate-like sputtered particles reach a substrate while maintaining their crystal states, whereby the CAAC-OS layer can be formed.

The conditions described below are preferably employed for the formation of the CAAC-OS layer.

By reducing the amount of impurities entering the CAAC-OS layer during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 700° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

Figure 19:
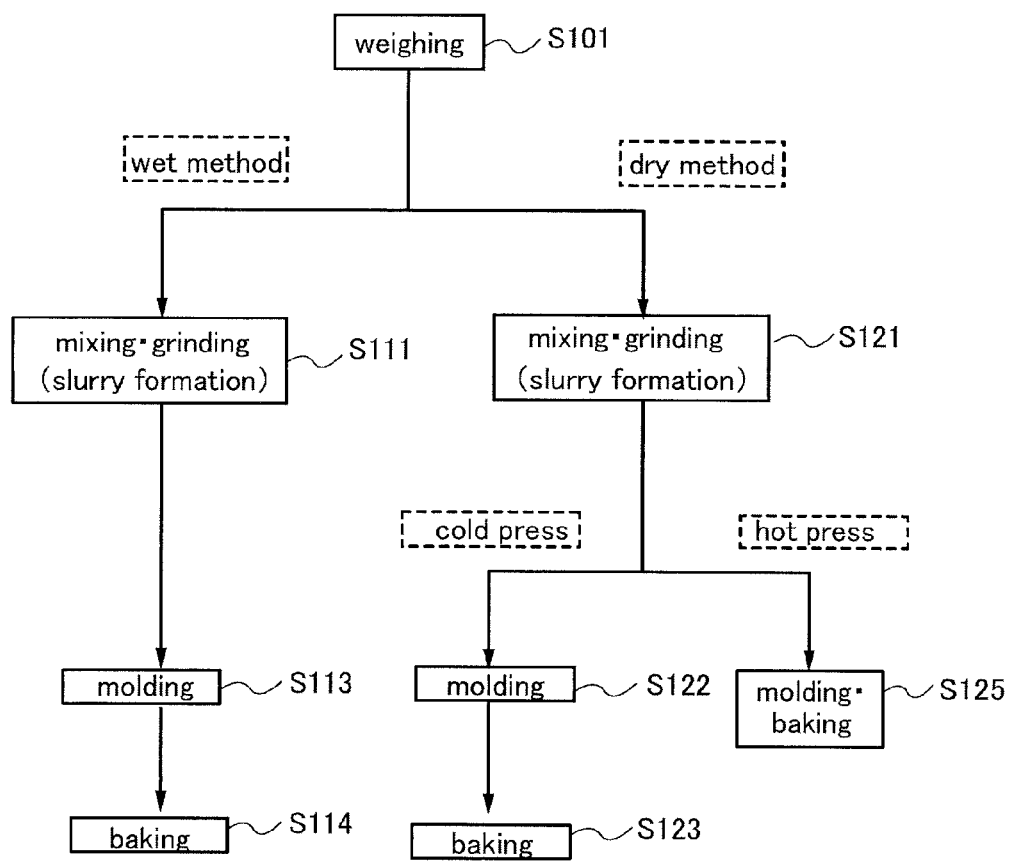
FIG. 19 is a flow chart illustrating manufacturing processes of sputtering targets.

Here, methods for manufacturing sputtering targets each including an oxide semiconductor including a crystal region in which the direction of the c-axis is parallel to a normal vector of the top surface of the oxide semiconductor will be described with reference to FIG. 19.

First, raw materials for the sputtering target are weighed (step S101).

Here, an $InO_X$ powder (a raw material of In), a $GaO_Y$ powder (a raw material of Ga), and a $ZnO_Z$ powder (a raw material of Zn) are prepared as raw materials for the sputtering target. Note that X, Y, and Z are each a given positive number; for example, X, Y, and Z are 1.5, 1.5, and 1, respectively. It is needless to say that the above raw materials are an example, and raw materials can be selected as appropriate in order to obtain a desired compound. For example, a $MO_Y$ raw material may be used instead of the $GaO_Y$ raw material. Note that Sn, Hf, or Al can be used as M. Alternatively, the following lanthanoid may be used as M: La, Ce, Pr, Nd, Sm, Eu, Gd, Tb, Dy, Ho, Er, Tm, Yb, or Lu. Although the case where three kinds of raw materials are used is shown as an example in this embodiment, one embodiment of the present invention is not limited thereto. For example, this embodiment may be applied to the case where four or more kinds of raw materials are used or the case where one or two kinds of raw materials are used.

Next, the InOx raw material, the $GaO_Y$ raw material, and the $ZnO_Z$ raw material are mixed in a predetermined ratio.

For example, the predetermined ratio of the $InO_X$ raw material, the $GaO_Y$ raw material, and the $ZnO_Z$ raw material is 2:2:1, 8:4:3, 3:1:1, 1:1:1, 1:3:2, 4:2:3, 1:1:2, 3:1:4, or 3:1:2 in a molar ratio. With the use of a mixed material having such a ratio, a sputtering target including an oxide semiconductor having a crystal region in which the direction of the c-axis is parallel to a normal vector of the top surface of the oxide semiconductor can be easily obtained.

More specifically, in the case of forming a sputtering target of In—Ga—Zn-based oxide having a composition of In:Ga:Zn=1:1:1 [atomic ratio], the raw materials are weighed so that $In_2O_3:Ga_2O_3:ZnO=1:1:2$ [molar ratio].

Note that also in the case where the $MO_Y$ raw material is used instead of the $GaO_Y$ raw material, the ratio of the $InO_X$ raw material, the $MO_Y$ raw material, and the $ZnO_Z$ raw material is 2:2:1, 8:4:3, 3:1:1, 1:1:1, 1:3:2, 4:2:3, 1:1:2, 3:1:4, or 3:1:2 in a molar ratio.

A method for forming the sputtering target using a wet method is described. The raw materials for the sputtering target are weighed, and then, the raw materials are ground and mixed with a ball mill or the like to obtain compound powder. After the plurality of raw materials is mixed, a crystalline oxide is formed by the first baking and is then reduced to compound powder by grinding. The grain size of the compound powder is greater than or equal to 0.01 μm and less than or equal to 1 μm, preferably greater than or equal to 0.01 μm and less than or equal to 0.5 μm, further preferably greater than or equal to 0.01 μm and less than or equal to 0.3 μm. Ion-exchange water, an organic additive, and the like are further mixed into the compound powder to form slurry (step S111).

Then, the slurry is poured into a mold provided with a moisture-permeable filter, so that moisture is removed. The mold may be formed using a metal or an oxide and the upper shape thereof is rectangular or rounded. The mold can be provided with one or more holes at the bottom. With the plurality of holes, moisture of the slurry can be removed rapidly. A porous resin, cloth, or the like may be used as the filter.

Moisture is removed from the slurry in such a manner that water is removed under reduced pressure through the hole provided at the bottom of the mold into which the slurry is poured. Next, the slurry from which moisture has been removed under reduced pressure is naturally dried. Thus, the slurry from which moisture has been removed is molded into the internal shape of the mold (step S113).

Then, the molded body is subjected to the second baking in an oxygen ($O_2$) atmosphere at 1400° C. (step S114). Through the above-described steps, the sputtering target can be obtained using a wet method.

Next, a method for forming the sputtering target using a dry method will be described. The raw materials for the sputtering target are weighed, and then, the raw materials are ground and mixed with a ball mill or the like to obtain compound powder (step S121).

The compound powder obtained is spread over a mold, and pressure is applied thereto with a pressing machine, whereby the raw material powder is molded to obtain a molded body (step S122).

The molded body is placed in a heating apparatus such as an electric furnace and baked in an oxygen ($O_2$) atmosphere at a temperature of 1400° C. (step S123). Note that in this embodiment, a method in which a molding step and a baking step are separated as in step S122 and step S123 is referred to as a cold press method. As a comparison example of the cold press method, a hot press method in which a molding step and a baking step are concurrently performed will be described below.

First, the above-described steps up to and including step S121 are performed. The obtained compound powder is spread over the mold, and pressure is applied with a pressing machine to the compound powder provided on the inner side of the mold while the mold is heated in an argon (Ar) atmosphere at a temperature of 1000° C. In this manner, pressure is applied to the compound powder with the compound powder baked, whereby the compound powder can be molded to obtain a molded body (step S125).

Through the above-described steps, the sputtering target can be obtained.

Note that the oxide semiconductor layers 403a to 403c are preferably formed in succession without exposure to the air. By forming the oxide semiconductor layers in succession without exposure to the air, attachment of hydrogen or a hydrogen compound (e.g., adsorption water) onto surfaces of the oxide semiconductor layers can be prevented. Thus, the entry of impurities can be prevented. In a similar manner, the gate insulating film 402 and the oxide semiconductor layer 403a are preferably formed in succession without exposure to the air.

Figure 6:
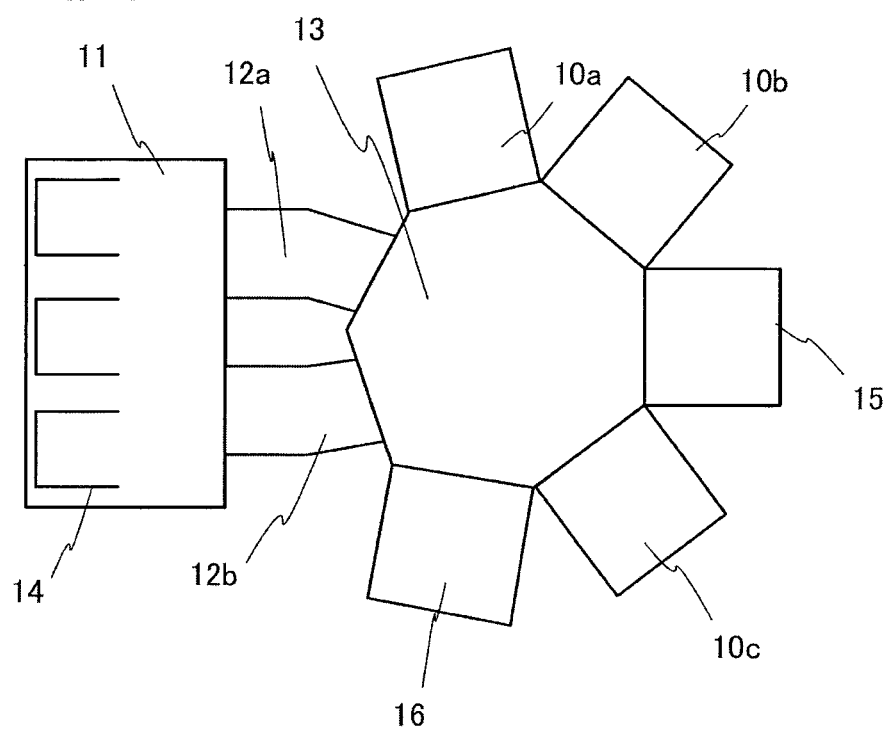
FIG. 6 is a top view illustrating an example of an apparatus for manufacturing a semiconductor device.

In the case where steps for stacking the first to third oxide semiconductor layers 403a to 403c in this order are performed successively without exposure to the air, a manufacturing apparatus a top view of which is illustrated in FIG. 6 may be used.

The manufacturing apparatus illustrated in FIG. 6 is single wafer multi-chamber equipment, which includes three sputtering devices 10a, 10b, and 10c, a substrate supply chamber 11 provided with three cassette ports 14 for holding a process substrate, load lock chambers 12a and 12b, a transfer chamber 13, a substrate heating chambers 15 and 16, and the like. Note that a transfer robot for transferring a process substrate is provided in each of the substrate supply chamber 11 and the transfer chamber 13. The atmospheres of the sputtering devices 10a, 10b, and 10c, the transfer chamber 13, and the substrate heating chambers 15 and 16 are preferably controlled so as to hardly contain hydrogen and moisture (i.e., an inert atmosphere, a reduced pressure atmosphere, or a dry air atmosphere). For example, a preferable atmosphere is a dry nitrogen atmosphere in which the dew point of moisture is −40° C. or lower, preferably −50° C. or lower.

An example of a procedure of the manufacturing steps with use of the manufacturing apparatus illustrated in FIG. 6 is as follows. The process substrate is transferred from the substrate supply chamber 11 to the substrate heating chamber 15 through the load lock chamber 12a and the transfer chamber 13; moisture attached to the process substrate is removed by vacuum baking in the substrate heating chamber 15; the process substrate is transferred to the sputtering device 10c through the transfer chamber 13; and the first oxide semiconductor layer 403a is deposited in the sputtering device 10c. Then, the process substrate is transferred to the sputtering device 10a through the transfer chamber 13 without exposure to air, and the second oxide semiconductor layer 403b is deposited in the sputtering device 10a. Then, the process substrate is transferred to the sputtering device 10b through the transfer chamber 13, and the third oxide semiconductor layer 403c is deposited in the sputtering device 10b. If needed, the process substrate is transferred to the substrate heating chamber 16 through the transfer chamber 13 without exposure to air and heat treatment is performed.

As described above, with use of the manufacturing apparatus illustrated in FIG. 6, a manufacturing process can proceed without exposure to air. Further, with the sputtering devices in the manufacturing apparatus in FIG. 6, a process without exposure to the air due to the change of the sputtering target can be achieved. As the sputtering devices in the manufacturing apparatus in FIG. 6, a parallel plate sputtering device, an ion beam sputtering device, a facing-target sputtering device, or the like may be used. In a facing-target type sputtering device, an object surface is separated from plasma and thus damage in deposition is small; therefore, a CAAC-OS layer having high crystallinity can be formed.

In the deposition of the oxide semiconductor layers in the sputtering devices 10a, 10b, and 10c, a high-purity gas with low impurity concentration such as hydrogen, water, hydroxyl, or hydride is used as a deposition gas.

The heat treatment may be performed under reduced pressure, in a nitrogen atmosphere, in an oxygen atmosphere, in ultra-dry air (air in which the moisture amount is less than or equal to 20 ppm (−55° C. by conversion into a dew point), preferably less than or equal to 1 ppm, further preferably less than or equal to 10 ppb, in the measurement with the use of a dew point meter in the cavity ring down laser spectroscopy (CRDS) system), or in a rare gas (argon, helium, or the like) atmosphere. It is preferable that water, hydrogen, and the like be not contained in the nitrogen atmosphere, in the oxygen atmosphere, in the ultra-dry air, in the rare gas atmosphere, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

Further, heat treatment is preferably performed on the oxide semiconductor layers 403a to 403c in order to remove excess hydrogen (including water and a hydroxyl group) contained therein (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. Hydrogen, which is an impurity imparting n-type conductivity, can be removed by the heat treatment.

Note that the heat treatment for the dehydration or dehydrogenation may be performed at any timing in the manufacturing process of the transistor as long as it is performed after the formation of the oxide semiconductor layer. For example, the heat treatment may be performed after the oxide semiconductor layer is processed into an island shape. The heat treatment for dehydration or dehydrogenation may be performed a plurality of times, and may also serve as another heat treatment. A laser irradiation apparatus may be used for the heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer is heated in the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (that is, the impurity concentration in the oxygen gas or the dinitrogen monoxide gas is preferably 1 ppm or lower, further preferably 0.1 ppm or lower). The oxygen gas or the dinitrogen monoxide gas acts to supply oxygen which is a main component of the oxide semiconductor and that has been reduced by the step of removing an impurity for the dehydration or dehydrogenation, so that the oxide semiconductor layer can have high purity and be an i-type (intrinsic) oxide semiconductor layer.

Since there is a possibility that oxygen is also released and reduced by dehydration or dehydrogenation treatment, oxygen (including at least one of an oxygen radical, an oxygen atom, and an oxygen ion) may be introduced into the oxide semiconductor layers which have been subjected to the dehydration or dehydrogenation treatment to supply oxygen to the layers.

Oxygen is added and supplied to the dehydrated or dehydrogenated oxide semiconductor layer, so that the oxide semiconductor layer can be highly purified and be i-type (intrinsic). Variations in electrical characteristics of a transistor having the highly-purified and i-type (intrinsic) oxide semiconductor are suppressed, and the transistor is electrically stable.

In the step of introduction of oxygen, oxygen may be directly introduced into the oxide semiconductor stacked film (oxide semiconductor layer) or may be introduced into the oxide semiconductor stacked film through another insulating layer to be formed later. As a method for introducing oxygen (including at least one of an oxygen radical, an oxygen atom, and an oxygen ion), an ion implantation method, an ion doping method, a plasma immersion ion implantation method, plasma treatment, or the like can be used. A gas containing oxygen can be used for oxygen introduction treatment. As the gas containing oxygen, oxygen, dinitrogen monoxide, nitrogen dioxide, carbon dioxide, carbon monoxide, and the like can be used. Further, a rare gas may be contained in the gas containing oxygen in the oxygen introduction treatment.

For example, in the case where an oxygen ion is implanted by an ion implantation method, the dose can be greater than or equal to $1 \times 10^{13}$ ions/cm$^2$ and less than or equal to $5 \times 10^{16}$ ions/cm$^2$.

The timing of supply of oxygen to the oxide semiconductor stacked film is not particularly limited to the above as long as it is after the formation of the oxide semiconductor stacked film. The step of introducing oxygen may be performed a plurality of times.

Figure 5C:
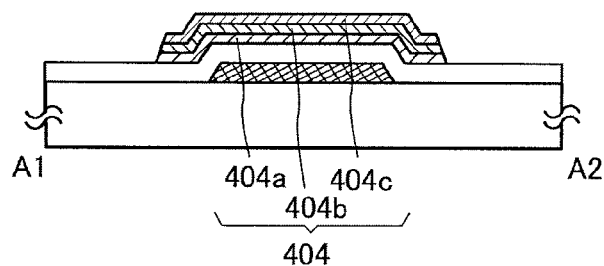
Figure 5D:
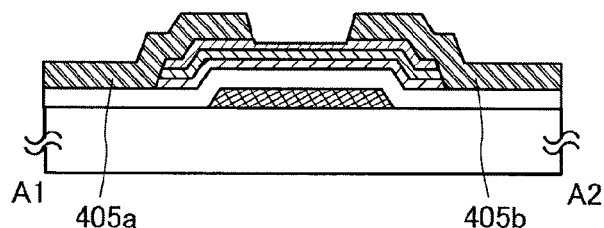

Next, the oxide semiconductor layers 403a to 403c are processed into the island-shaped first to third oxide semiconductor layers 404a to 404c by etching treatment using a photolithography method, whereby the oxide semiconductor stacked film 404 is formed (see FIG. 5C).

Note that in this embodiment, the first to third oxide semiconductor layers 404a to 404c are processed into island shapes by one etching treatment; thus, the ends of the oxide semiconductor layers included in the oxide semiconductor stacked film 404 are aligned with each other. Note that in this specification, "aligning with" includes "substantially aligning with". For example, an end of a layer A and an end of a layer B, which are included in a stacked structure and etched using the same mask, are considered to be aligned with each other.

Then, a conductive film is formed over the oxide semiconductor stacked film 404 and processed into the source electrode layer 405a and the drain electrode layer 405b (including a wiring formed using the same layer).

The source electrode layer 405a and the drain electrode layer 405b can be formed using, for example, a metal film containing an element selected from aluminum, chromium, copper, tantalum, titanium, molybdenum, and tungsten, a metal nitride film containing any of these elements as its component (a titanium nitride film, a molybdenum nitride film, or a tungsten nitride film), or the like. Alternatively, a film of a high-melting-point metal such as titanium, molybdenum, or tungsten or a metal nitride film of any of these elements (a titanium nitride film, a molybdenum nitride film, or a tungsten nitride film) may be stacked on one of or both a bottom side and a top side of a metal film of aluminum, copper, or the like. Further alternatively, the conductive film used as the source electrode layer 405a and the drain electrode layer 405b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used.

The insulating film 406 can be formed by a plasma CVD method, a sputtering method, a vacuum evaporation method, or the like.

The insulating film 406 can be a single layer or a stacked layer of a silicon oxide film, a silicon oxynitride film, an aluminum oxide film, an aluminum oxynitride film, an inorganic insulating film such as a gallium oxide film, a hafnium oxide film, a magnesium oxide film, a zirconium oxide film, a lanthanum oxide film, a barium oxide film, a silicon nitride film, a silicon nitride oxide film, an aluminum nitride film, or an aluminum nitride oxide film, or the like.

In this embodiment, as the insulating film 406, a silicon oxide film is formed.

Here, in order to form an oxygen-excess region in the insulating film 406, the step of adding oxygen may be performed. The step of adding oxygen to the insulating film 406 can be performed in a manner similar to the step of adding oxygen to the gate insulating film 402.

In addition, a planarization insulating film may be formed over the transistor in order to reduce surface unevenness due to the transistor. As the planarization insulating film, an organic material such as a polyimide-, acrylic-, or benzocyclobutene-based resin can be used. Other than such organic materials, it is also possible to use a low-dielectric constant material (a low-k material) or the like. Note that the planarization insulating film may be formed by stacking a plurality of insulating films formed of these materials.

Figure 5E:
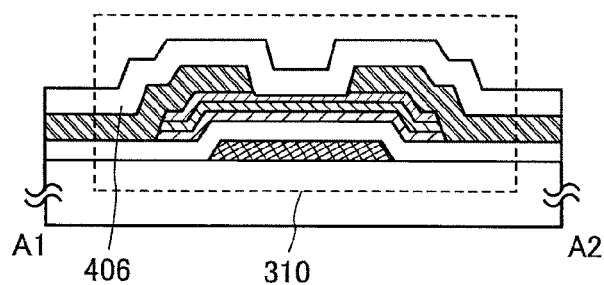

Through the above steps, a semiconductor device of the present invention can be manufactured (see FIG. 5E).

By using an oxide insulating film as the insulating film in contact with the oxide semiconductor stacked film 404 or by forming an oxygen excess region in the insulating film, excess oxygen included in the insulating film can be supplied to the oxide semiconductor stacked film by heat treatment or the like. This can reduce oxygen vacancies included in the oxide semiconductor stacked film.

With the three-layer structure of the oxide semiconductor layers as illustrated in FIG. 5E, when a voltage is applied to the gate electrode layer 401, carriers move not in the vicinity of the interface between the gate insulating film 402 and the first oxide semiconductor layer 404a but in the vicinity of the interface between the first oxide semiconductor layer 404a and the second oxide semiconductor layer 404b. The first oxide semiconductor layer 404a and the second oxide semiconductor layer 404b are oxide semiconductor layers including the same constituent elements but with different atomic ratios. Thus, the amount of oxygen vacancies formed in the vicinity of the interface with the first oxide semiconductor layer 404a in the second oxide semiconductor layer 404b can be smaller than the amount of oxygen vacancies formed in the vicinity of the interface with the gate insulating film 402 in the first oxide semiconductor layer 404a. Accordingly, even when carriers move in the vicinity of the interface between the first oxide semiconductor layer 404a and the second oxide semiconductor layer 404b, the influence of localized states due to oxygen vacancies can be small. This can suppress variation in electrical characteristics of the transistor, and a highly reliable transistor can be provided.

FIGS. 7A to 7D illustrate various stacking modes of the oxide semiconductor stacked film in a bottom-gate transistor. The structures other than the oxide semiconductor stacked film are similar to those of the transistor 430 in FIG. 4A.

Figure 7A:
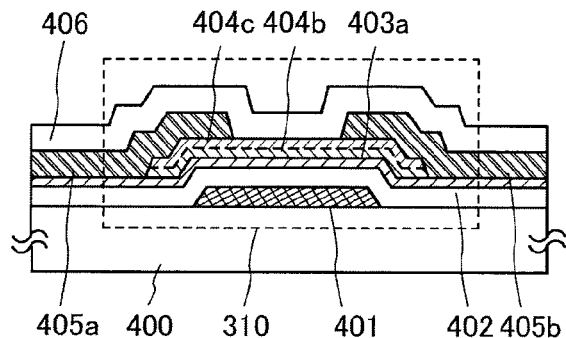
FIGS. 7A to 7D are cross-sectional views of semiconductor devices.

FIG. 7A illustrates a transistor 310 including the oxide semiconductor stacked film in which the second oxide semiconductor layer 404b and the third oxide semiconductor layer 404c are processed into an island shape and the first oxide semiconductor layer 403a is not processed. The third oxide semiconductor layer 404c can become a film having a crystal structure by being formed over the second oxide semiconductor layer 404b having a crystal structure.

Figure 7B:
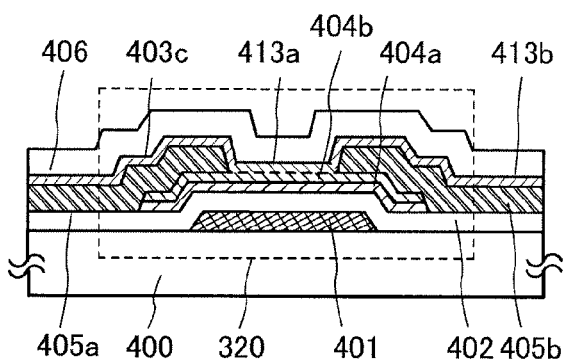

FIG. 7B illustrates a transistor 320 including the oxide semiconductor stacked film in which the first oxide semiconductor layer 404a and the second oxide semiconductor layer 404b are processed into an island shape and the third oxide semiconductor layer 403c is not processed. The third oxide semiconductor layer 403c has a crystal structure in at least a region 413a which is in contact with the second oxide semiconductor layer 404b by being formed over the second oxide semiconductor layer 404b having a crystal structure. The other region 413b has an amorphous structure.

Figure 7C:
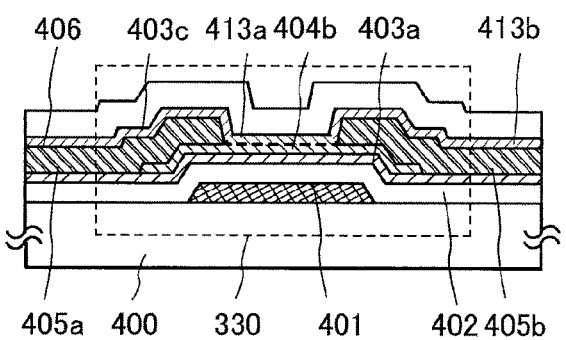

FIG. 7C illustrates a transistor 330 including the oxide semiconductor stacked film in which the second oxide semiconductor layer 404b is processed into an island shape and the first oxide semiconductor layer 403a and the third oxide semiconductor layer 403c are not processed. In the same manner as that of the transistor illustrated in FIG. 7B, the third oxide semiconductor layer 403c has a crystal structure in at least the region 413a which is in contact with the second oxide semiconductor layer 404b by being formed over the second oxide semiconductor layer 404b having a crystal structure. The other region 413b has an amorphous structure.

Figure 7D:
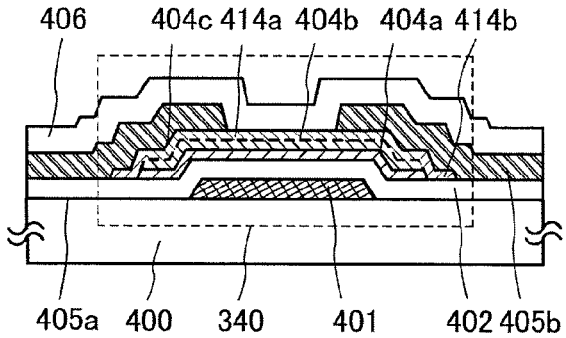

FIG. 7D illustrates a transistor 340 including the oxide semiconductor stacked film in which the first oxide semiconductor layer 404a and the second oxide semiconductor layer 404b are processed into an island shape and the third oxide semiconductor layer 404c is provided so as to cover a side surface of the first oxide semiconductor layer 404a and a side surface of the second oxide semiconductor layer 404b. In the same manner as that of the transistor illustrated in FIG. 7B, the third oxide semiconductor layer 404c has a crystal structure in at least the region 414a which is the region in contact with the second oxide semiconductor layer 404b by being formed over the second oxide semiconductor layer 404b having a crystal structure. The other region 414b has an amorphous structure.

FIGS. 8A to 8D illustrate various stacking modes of the oxide semiconductor stacked film in a top-gate transistor. The structures other than the oxide semiconductor stacked film are similar to those of the transistor 450 in FIG. 4C.

Figure 8A:
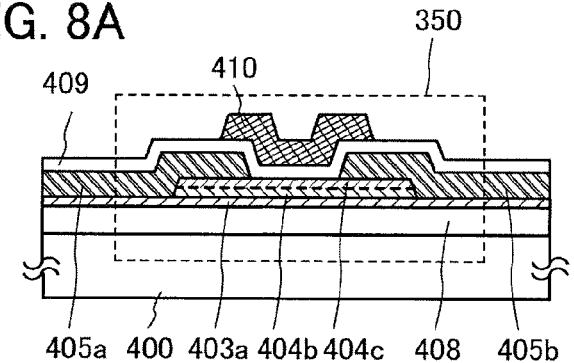
FIGS. 8A to 8D are cross-sectional views of semiconductor devices.

FIG. 8A illustrates a transistor 350 including the oxide semiconductor stacked film in which the second oxide semiconductor layer 404b and the third oxide semiconductor layer 404c are processed into an island shape and the first oxide semiconductor layer 403a is not processed. The third oxide semiconductor layer 404c can become a film having a crystal structure by being formed over the second oxide semiconductor layer 404b having a crystal structure.

Figure 8B:
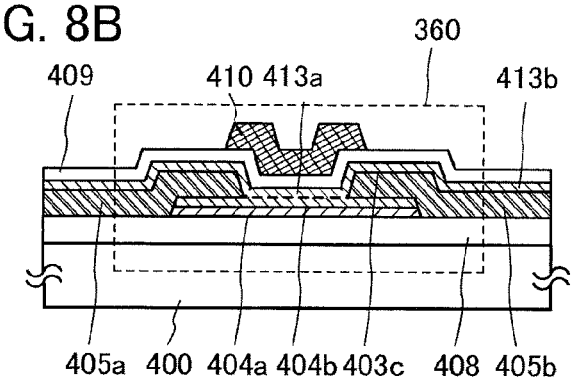

FIG. 8B illustrates a transistor 360 in which the first oxide semiconductor layer 404a and the second oxide semiconductor layer 404b are processed into an island shape and the third oxide semiconductor layer 403c is not processed. The third oxide semiconductor layer 403c has a crystal structure in at least the region 413a which is in contact with the second oxide semiconductor layer 404b by being formed over the second oxide semiconductor layer 404b having a crystal structure. The other region 413b has an amorphous structure.

Figure 8C:
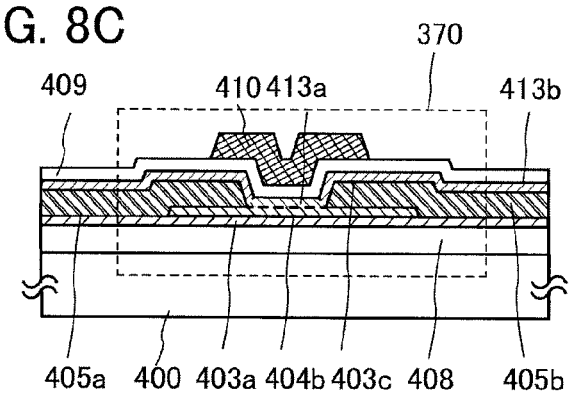

FIG. 8C illustrates a transistor 370 including the oxide semiconductor stacked film in which the second oxide semiconductor layer 404b is processed into an island shape and the first oxide semiconductor layer 403a and the third oxide semiconductor layer 403c are not processed. In the same manner as that of the transistor illustrated in FIG. 8B, the third oxide semiconductor layer 403c has a crystal structure in at least the region 413a which is in contact with the second oxide semiconductor layer 404b by being formed over the second oxide semiconductor layer 404b having a crystal structure. The other region 413b has an amorphous structure.

Figure 8D:
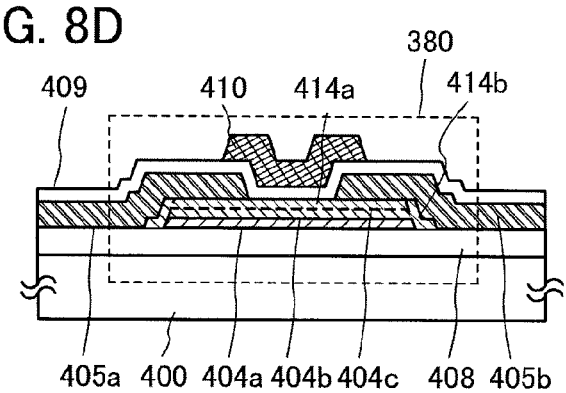

FIG. 8D illustrates a transistor 380 including the oxide semiconductor stacked film in which the first oxide semiconductor layer 404a and the second oxide semiconductor layer 404b are processed into an island shape and the third oxide semiconductor layer 404c is provided so as to cover a side surface of the first oxide semiconductor layer 404a and a side surface of the second oxide semiconductor layer 404b. In the same manner as that of the transistor illustrated in FIG. 8B, the third oxide semiconductor layer 404c has a crystal structure in at least the region 414a which is the region in contact with the second oxide semiconductor layer 404b by being formed over the second oxide semiconductor layer 404b having a crystal structure. The other region 414b has an amorphous structure.

A metal oxide included in an oxide semiconductor and having higher proportion of indium is a metal oxide having higher conductivity. For example, the indium content of the second oxide semiconductor layer is made to be higher than those of the first oxide semiconductor layer and the third oxide semiconductor layer, whereby the conductivity $\sigma_2$ of the second oxide semiconductor layer can be higher than the conductivity $\sigma_1$ of the first oxide semiconductor layer and the conductivity $\sigma_3$ of the third oxide semiconductor layer.

The conductivity az is preferably 1000 times or more, further preferably 100000 times or more as high as the conductivity $\sigma_1$ and the conductivity $\sigma_3$.

For example, the conductivity of the oxide semiconductor layer with an atomic ratio In:Ga:Zn=1:1:1 is $6.5 \times 10^{-5}$ S/cm to $4.5 \times 10^{-1}$ S/cm. Further, the conductivity of the oxide semiconductor layer with an atomic ratio In:Ga:Zn=3:1:2 is 2.0 S/cm to 9.7 S/cm. Furthermore, the conductivity of the oxide semiconductor layer with an atomic ratio In:Ga:Zn=1:3:2 is $1 \times 10^{-7}$ S/cm (lower than the lower measurement limit).

Accordingly, even when the oxide semiconductor layer with an atomic ratio In:Ga:Zn=1:3:2 is used as the unprocessed first oxide semiconductor layer 404a or the third oxide semiconductor layer 404c, the first to third oxide semiconductor layers do not function as the leak path of carriers.

With the above-described stacked structure of the oxide semiconductor stacked film 404, when a voltage is applied to the gate electrode layer 410, carriers move not in the vicinity of the interface between the gate insulating film 409 and the third oxide semiconductor layer 404c but in the vicinity of the interface between the third oxide semiconductor layer 404c and the second oxide semiconductor layer 404b. The second oxide semiconductor layer 404b and the third oxide semiconductor layer 404c are oxide semiconductor layers including the same constituent elements but with different atomic ratios. Thus, the amount of oxygen vacancies formed in the vicinity of the interface with the third oxide semiconductor layer 404c in the second oxide semiconductor layer 404b can be smaller than the amount of oxygen vacancies formed in the vicinity of the interface with the gate insulating film 409 in the third oxide semiconductor layer 404c.

Further, the third oxide semiconductor layer 404c is the film including the region 413a (or the region 414a) which is formed by crystal growth using the crystal part included in the second oxide semiconductor layer 404b as a seed crystal. This can further reduce the amount of oxygen vacancies formed in the vicinity of the interface with the third oxide semiconductor layer 404c in the second oxide semiconductor layer 404b.

Accordingly, even when carriers move in the vicinity of the interface between the third oxide semiconductor layer 404c and the second oxide semiconductor layer 404b, the influence of localized states due to oxygen vacancies can be small. This can suppress variation in electrical characteristics of the transistor, and a highly reliable transistor can be provided.

The structures, methods, and the like described in this embodiment can be combined as appropriate with any of the structures, methods, and the like described in the other embodiments.

(Embodiment 3)

A semiconductor device having a display function (also referred to as a display device) can be manufactured using any of the transistors described in Embodiment 1. Further, part or all of the driver circuitry which includes the transistor can be formed over a substrate where a pixel portion is formed, whereby a system-on-panel can be formed.

Figure 9A:
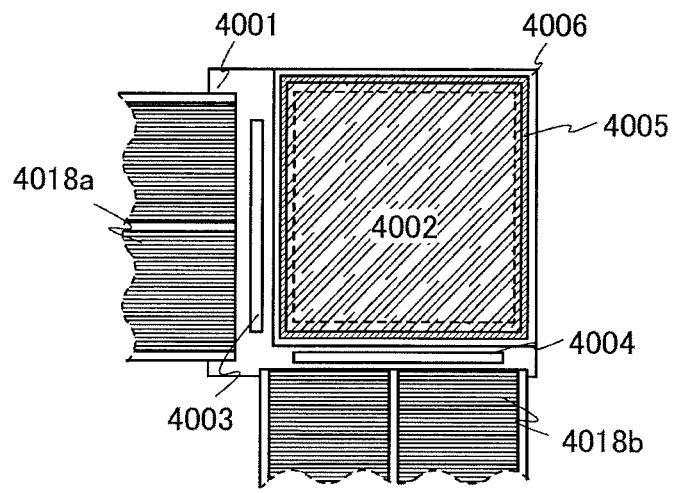
FIGS. 9A to 9C illustrate one embodiment of a semiconductor device.

In FIG. 9A, a sealant 4005 is provided so as to surround a pixel portion 4002 provided over a substrate 4001, and the pixel portion 4002 is sealed with a substrate 4006. In FIG. 9A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region which is different from the region surrounded by the sealant 4005. Various signals and potentials which are provided to the pixel portion 4002 through the signal line driver circuit 4003 and the scan line driver circuit 4004 are supplied from flexible printed circuits (FPCs) 4018a and 4018b.

Figure 9B:
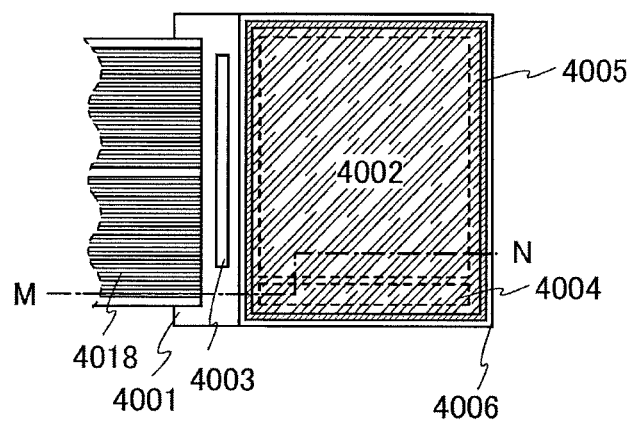
Figure 9C:
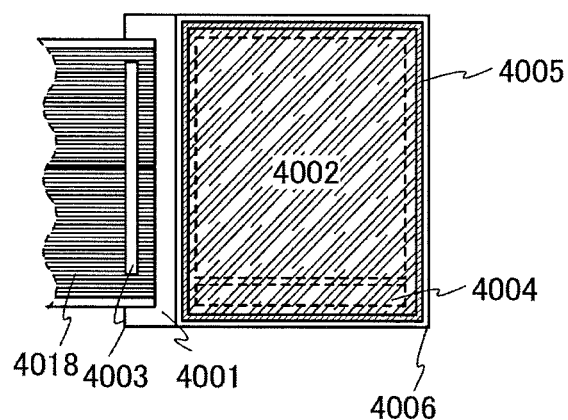

In FIGS. 9B and 9C, the sealant 4005 is provided so as to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIGS. 9B and 9C, the signal line driver circuit 4003 which is formed using a single crystal semiconductor film or a polycrystalline semiconductor film over an IC chip or a substrate separately prepared is mounted on the substrate 4001, in a region which is different from the region surrounded by the sealant 4005. In FIGS. 9B and 9C, various signals and potentials are supplied to the pixel portion 4002 through the signal line driver circuit 4003 and the scan line driver circuit 4004 from an FPC 4018.

Although FIGS. 9B and 9C each illustrate an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 9A illustrates an example in which the signal line driver circuit 4003 and the scan line driver circuit 4004 are mounted by a COG method. FIG. 9B illustrates an example in which the signal line driver circuit 4003 is mounted by a COG method. FIG. 9C illustrates an example in which the signal line driver circuit 4003 is mounted by a TAB method.

Note that the display device includes a panel in which the display element is sealed, and a module in which an IC including a controller or the like is mounted on the panel. In other words, the display device in this specification means an image display device or a light source (including a lighting device). Furthermore, the display device also includes the following modules in its category: a module to which a connector such as an FPC, a TAB tape, or a TCP is attached; a module having a TAB tape or TCP at the end of which a printed wiring board is provided; and a module in which an integrated circuit (IC) is directly mounted on a display element by a COG method.

The pixel portion and the scan line driver circuit provided over the substrate include a plurality of transistors, and any of the transistors described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as an electronic ink display (electronic paper), can be used.

Modes of the semiconductor device are described with reference to FIGS. 9A to 9C and FIGS. 10A and 10B. FIGS. 10A and 10B correspond to cross-sectional views along line M-N in FIG. 9B. Examples of a liquid crystal display device using a liquid crystal element as a display element are illustrated in FIGS. 10A and 10B.

A liquid crystal display device can employ a vertical electric field mode or a horizontal electric field mode. FIG. 10A illustrates an example in which a vertical electric field mode is employed, and FIG. 10B illustrates an example in which a fringe field switching (FFS) mode, which is one of the horizontal electric field modes, is employed.

Note that in a display panel, a transistor 4010 provided in the pixel portion 4002 is electrically connected to a display element. A variety of display elements can be used as long as display can be performed.

As illustrated in FIGS. 9A to 9C and FIGS. 10A and 10B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed from the same conductive layer as a first electrode layer 4034 and a conductive layer 4036 included in a transistor 4011. The terminal electrode 4016 is formed from the same conductive layer as gate electrode layers of the transistor 4010 and the transistor 4011.

The pixel portion 4002 and the scan line driver circuit 4004 provided over the substrate 4001 include a plurality of transistors. FIGS. 9A to 9C and FIGS. 10A and 10B illustrate the transistor 4010 included in the pixel portion 4002 and the transistor 4011 included in the scan line driver circuit 4004. In FIGS. 10A and 10B, insulating layers 4032a and 4032b are provided over the transistors 4010 and 4011.

In FIG. 10B, the first electrode layer 4034 is provided over the insulating layer 4032b. The first electrode layer 4034 is connected to a source electrode layer or a drain electrode layer of the transistor 4010 through an opening provided in the insulating layers 4032a and 4032b. Further, an insulating layer 4042 is provided between the first electrode layer 4034 and a second electrode layer 4031.

Any of the transistors described in Embodiment 1 can be applied to the transistors 4010 and 4011. In this embodiment, an example in which a transistor having a structure similar to that of the transistor 420 is used as the transistor 4010, and a transistor having a structure similar to that of the transistor 460 is used as the transistors 4041 is described. The transistor 4010 is a bottom-gate transistor, and the transistor 4011 is a dual-gate transistor.

The transistors 4010 and 4011 each have a stacked structure of gate insulating layers 4020a and 4020b. In FIG. 10A, the gate insulating layers 4020a and 4020b of the transistors 4010 and 4011 and the insulating layers 4032a and 4032b provided over the transistors 4010 and 4011 are extended below the sealant 4005 so as to cover the end of the connection terminal electrode 4015. In FIG. 10B, the gate insulating layer 4020a and the insulating layer 4032b are extended below the sealant 4005 so as to cover the end of the connection terminal electrode 4015, and the insulating layer 4032b covers side surfaces of the gate insulating layer 4020b and the insulating layer 4032a.

By using the oxide semiconductor stacked film described in the above embodiments in the transistors 4010 and 4011, when a voltage is applied to the gate electrode layer, electrons move not in the vicinity of the interface between the gate insulating film and the first oxide semiconductor layer but in the vicinity of the interface between the first oxide semiconductor layer and the second oxide semiconductor layer. The first oxide semiconductor layer and the second oxide semiconductor layer are oxide semiconductor layers including the same constituent elements but with different atomic ratios. Thus, the amount of oxygen vacancies formed in the vicinity of the interface with the first oxide semiconductor layer in the second oxide semiconductor layer can be smaller than the amount of oxygen vacancies formed in the vicinity of the interface with the gate insulating film in the first oxide semiconductor layer. Accordingly, even when electrons move in the vicinity of the interface between the first oxide semiconductor layer and the second oxide semiconductor layer, the influence of localized states due to oxygen vacancies can be small. This can suppress variation in electrical characteristics of the transistor, and a highly reliable transistor can be provided.

By using the dual-gate transistor 4011 in the scan line driver circuit 4004, the amount of change in threshold voltage can be further reduced, which improves reliability. The conductive layer 4036 included in the transistor 4011 may have the same potential as or a potential different from that of a gate electrode layer of the transistor 4011, and can function as a second gate electrode layer. The potential of the conductive layer 4036 may be GND, a negative potential, or in a floating state. FIGS. 10A and 10B each illustrate an example in which the transistor 4011 including the conductive layer 4036 is provided in the scan line driver circuit 4004; however, a dual-gate transistor may be provided in the signal line driver circuit 4003 in FIGS. 9A to 9B as well.

The conductive layer also has a function of blocking an external electric field, that is, preventing an external electric field (particularly, preventing static electricity) from influencing the inside (a circuit portion including a transistor). The blocking function of the conductive layer can suppress variations in the electrical characteristics of the transistor due to an influence of an external electric field such as static electricity.

In FIGS. 10A and 10B, a liquid crystal element 4013 includes a first electrode layer 4034, a second electrode layer 4031, and a liquid crystal layer 4008. Note that insulating layers 4033 and 4038 serving as alignment films are provided so that the liquid crystal layer 4008 is sandwiched therebetween.

In FIG. 10A, the second electrode layer 4031 is provided on the substrate 4006 side, and the first electrode layer 4034 and the second electrode layer 4031 are stacked with the liquid crystal layer 4008 interposed therebetween. In FIG. 10B, the second electrode layer 4031 having an opening pattern is provided below the liquid crystal layer 4008, and the first electrode layer 4034 having a flat plate shape is provided below the second electrode layer 4031 with the insulating layer 4042 interposed therebetween. In FIG. 10B, the second electrode layer 4031 having an opening pattern includes a bent portion or a comb-shaped portion. An arrangement of the first electrode layer 4034 and the second electrode layer 4031, which complies with both conditions that they have the same shape and they overlap with each other, is avoided in order to generate an electric field between the electrodes. Note that a structure may be employed in which a planarization insulating layer is provided, the second electrode layer 4031 having a flat plate shape is formed in contact with the planarization insulating layer, and the first electrode layer 4034 having an opening pattern and serving as a pixel electrode is formed over the second electrode layer 4031 with the insulating layer 4042 interposed therebetween.

The first electrode layer 4034 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layer 4034 and the second electrode layer 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A conductive composition containing a conductive high molecule (also referred to as a conductive polymer) can be used for the first electrode layer 4034 and the second electrode layer 4031.

A columnar spacer denoted by reference numeral 4035 is obtained by selective etching of an insulating layer and is provided in order to control the thickness of the liquid crystal layer 4008 (a cell gap). Alternatively, a spherical spacer may be used.

In the case of a horizontal electric field mode an example of which is illustrated in FIG. 10B, a liquid crystal composition exhibiting a blue phase for which an alignment film is unnecessary may be used for the liquid crystal layer 4008. In this case, the liquid crystal layer 4008 is in contact with the first electrode layer 4034 and the second electrode layer 4031.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. In the case of using a transistor including the oxide semiconductor layer disclosed in this specification, a storage capacitor having a capacitance that is ⅓ or less, preferably ⅕ or less of liquid crystal capacitance of each pixel is enough.

In the transistor including an oxide semiconductor layer, which is disclosed in this specification, the current in an off state (off-state current) can be made small. Accordingly, an electric signal such as image data can be held for a longer period and a writing interval can be set longer. Thus, the frequency of refresh operation can be reduced, which leads to an effect of suppressing power consumption.

The transistor which includes the oxide semiconductor layer disclosed in this specification can have high field-effect mobility and thus can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used.

In order to extract light emitted from the light-emitting element, at least one of the pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figure 11A:
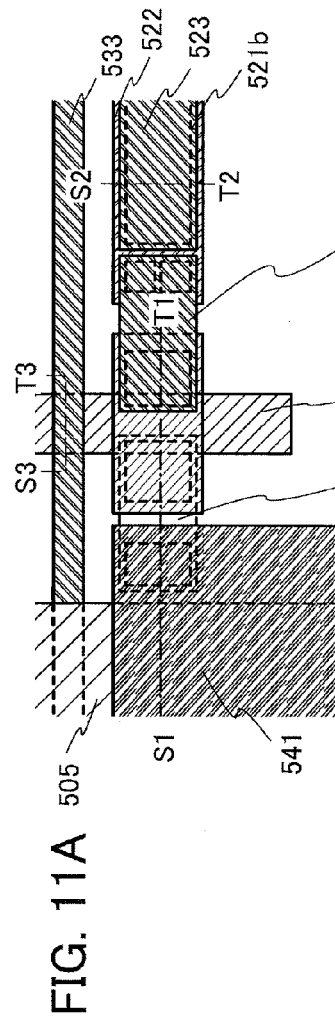
FIGS. 11A and 11B illustrate one embodiment of a semiconductor device.
Figure 11B:
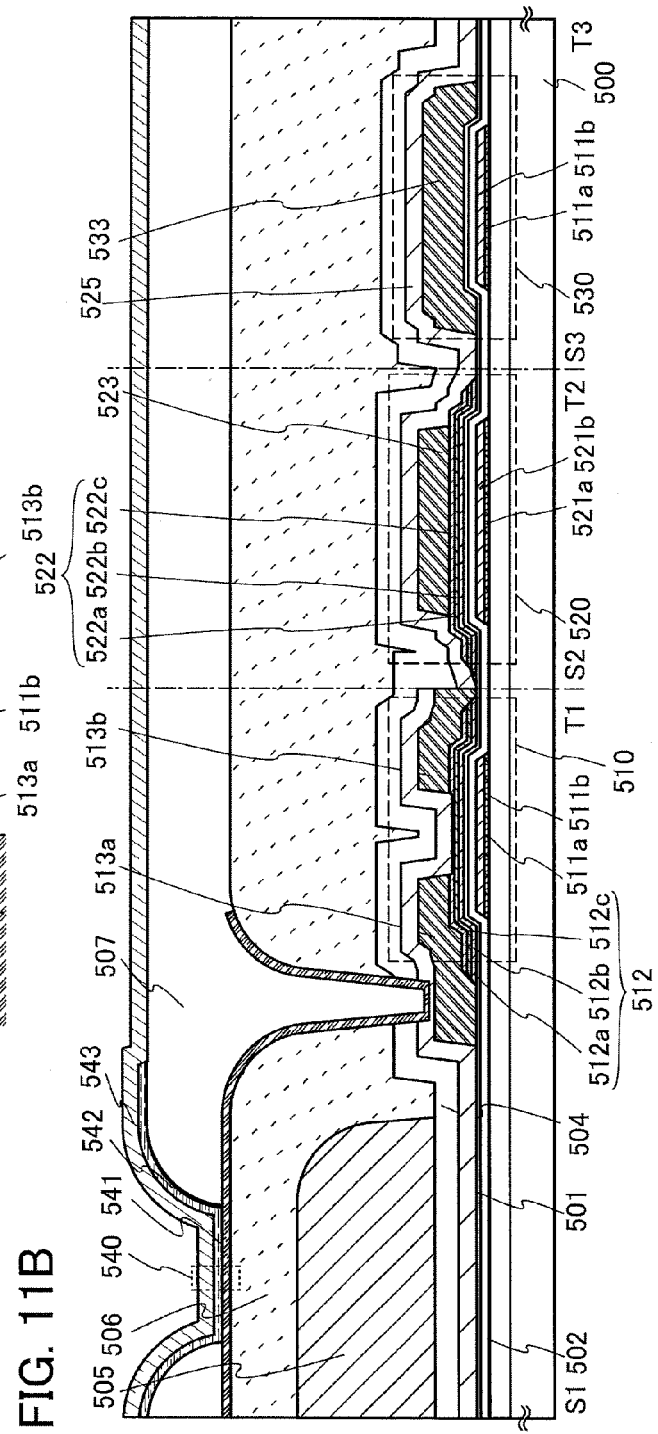

An example of a display device in which a light-emitting element is used as a display element is illustrated in FIGS. 11A and 11B.

FIG. 11A is a plan view of the light-emitting device, and FIG. 11B is a cross-sectional view taken along dashed-dotted lines S1-T1, S2-T2, and S3-T3 in FIG. 11A. Note that an electroluminescent layer 542 and a second electrode layer 543 are not illustrated in the plan view in FIG. 11A.

The light-emitting device illustrated in FIGS. 11A and 11B includes, over a substrate 500, a transistor 510, a capacitor 520, and a wiring layer intersection 530. The transistor 510 is electrically connected to a light-emitting element 540. Note that FIGS. 11A and 11B illustrate a bottom-emission light-emitting device in which light from the light-emitting element 540 is extracted through the substrate 500.

Any of the transistors described in Embodiment 1 can be applied to the transistor 510. In this embodiment, an example in which a transistor having a structure similar to that of the transistor 320 described in Embodiment 1 is used is described. The transistor 510 is a bottom-gate transistor.

The transistor 510 includes gate electrode layers 511a and 511b, gate insulating layers 501 and 502, an oxide semiconductor stacked film 512 which includes a first oxide semiconductor layer 512a, a second oxide semiconductor layer 512b, and a third oxide semiconductor layer 512c, and conductive layers 513a and 513b serving as source and drain electrode layers. In addition, an insulating layer 525 is formed over the transistor 510.

The capacitor 520 includes conductive layers 521a and 521b, the gate insulating layers 501 and 502, an oxide semiconductor stacked film 522 which includes a first oxide semiconductor layer 522a, a second oxide semiconductor layer 522b, and a third oxide semiconductor layer 522c, and a conductive layer 523. The gate insulating layers 501 and 502 and the oxide semiconductor stacked film 522 are sandwiched between the conductive layer 523 and the conductive layers 521a and 521b, whereby the capacitor is formed.

The wiring layer intersection 530 is an intersection of a conductive layer 533 and the gate electrode layers 511a and 511b. The conductive layer 533 and the gate electrode layers 511a and 511b intersect with each other with the gate insulating layers 501 and 502 interposed therebetween.

In this embodiment, a 30-nm-thick titanium film is used as each of the gate electrode layer 511a and the conductive layer 521a, and a 200-nm-thick copper thin film is used as each of the gate electrode layer 511b and the conductive layer 521b. Thus, the gate electrode layer has a stacked structure of the titanium film and the copper thin film.

By using the oxide semiconductor stacked film described in the above embodiments in the transistor 510, when a voltage is applied to the gate electrode layer, electrons move not in the vicinity of the interface between the gate insulating film and the first oxide semiconductor layer but in the vicinity of the interface between the first oxide semiconductor layer and the second oxide semiconductor layer. The first oxide semiconductor layer and the second oxide semiconductor layer are oxide semiconductor layers including the same constituent elements but with different atomic ratios. Thus, the amount of oxygen vacancies formed in the vicinity of the interface with the first oxide semiconductor layer in the second oxide semiconductor layer can be smaller than the amount of oxygen vacancies formed in the vicinity of the interface with the gate insulating film in the first oxide semiconductor layer. Accordingly, even when electrons move in the vicinity of the interface between the first oxide semiconductor layer and the second oxide semiconductor layer, the influence of localized states due to oxygen vacancies can be small. This can suppress variation in electrical characteristics of the transistor, and a highly reliable transistor can be provided.

An interlayer insulating layer 504 is formed over the transistor 510, the capacitor 520, and the wiring layer intersection 530. Over the interlayer insulating layer 504, a color filter layer 505 is provided in a region overlapping with the light-emitting element 540. An insulating layer 506 serving as a planarization insulating layer is provided over the interlayer insulating layer 504 and the color filter layer 505.

The light-emitting element 540 having a stacked structure in which a first electrode layer 541, the electroluminescent layer 542, and the second electrode layer 543 are stacked in this order is provided over the insulating layer 506. The first electrode layer 541 and the conductive layer 513a are in contact with each other in an opening formed in the insulating layer 506 and the interlayer insulating layer 504, which reaches the conductive layer 513a; thus the light-emitting element 540 and the transistor 510 are electrically connected to each other. Note that a partition 507 is provided so as to cover part of the first electrode layer 541 and the opening.

As the color filter layer 505, for example, a chromatic light-transmitting resin can be used.

The partition 507 can be formed using an organic insulating material or an inorganic insulating material.

The electroluminescent layer 542 may be formed using either a single layer or a stack of a plurality of layers.

A protective film may be formed over the second electrode layer 543 and the partition 507 in order to prevent oxygen, hydrogen, moisture, carbon dioxide, or the like from being mixed into the light-emitting element 540. As the protective film, a silicon nitride film, a silicon nitride oxide film, a DLC film, or the like can be formed.

Further, the light-emitting element 540 may be covered with a layer containing an organic compound deposited by an evaporation method so that oxygen, hydrogen, moisture, carbon dioxide, or the like is not mixed into the light-emitting element 540.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven (also referred to as electrophoretic display device or electrophoretic display) can be provided as a display device.

The insulating layer 506 serving as a planarization insulating layer can be formed using an organic material having heat resistance, such as an acrylic resin, polyimide, a benzocyclobutene-based resin, polyamide, or an epoxy resin. Other than such organic materials, it is also possible to use a low-dielectric constant material (low-k material) such as a siloxane-based resin, phosphosilicate glass (PSG), or borophosphosilicate glass (BPSG). Note that the insulating layer 506 may be formed by stacking a plurality of insulating layers formed using any of these materials. Note that the planarization insulating layer is not necessarily provided.

Materials similar to those of the first electrode layer 4034 and the second electrode layer 4031 illustrated in FIGS. 10A and 10B can be used for the first electrode layer 541 and the second electrode layer 543.

In this embodiment, since the light-emitting device illustrated in FIGS. 11A and 11B has a bottom-emission structure, the first electrode layer 541 has a light-transmitting property and the second electrode layer 543 has a light-reflecting property. Accordingly, in the case of using a metal film as the first electrode layer 541, the film is preferably thin enough to keep the light-transmitting property; meanwhile, in the case of using a light-transmitting conductive film as the second electrode layer 543, a conductive layer having a light-reflecting property is preferably stacked thereon.

A protective circuit for protecting the driver circuit may be provided. The protection circuit is preferably formed using a nonlinear element.

As described above, by applying any of the transistors described in Embodiment 1 to a display device, the display device can have a variety of functions.

The structures, methods, and the like described in this embodiment can be combined as appropriate with any of the structures, methods, and the like described in the other embodiments.

(Embodiment 4)

A semiconductor device having an image sensor function of reading information on an object can be manufactured using any of the transistors described in Embodiment 1.

Figure 12A:
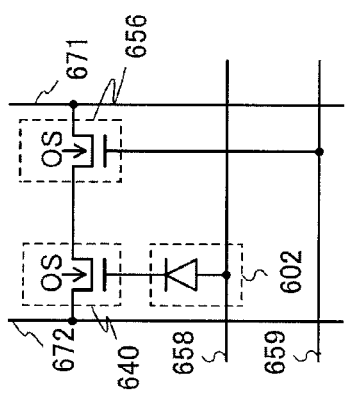
FIGS. 12A and 12B illustrate one embodiment of a semiconductor device.
Figure 12B:
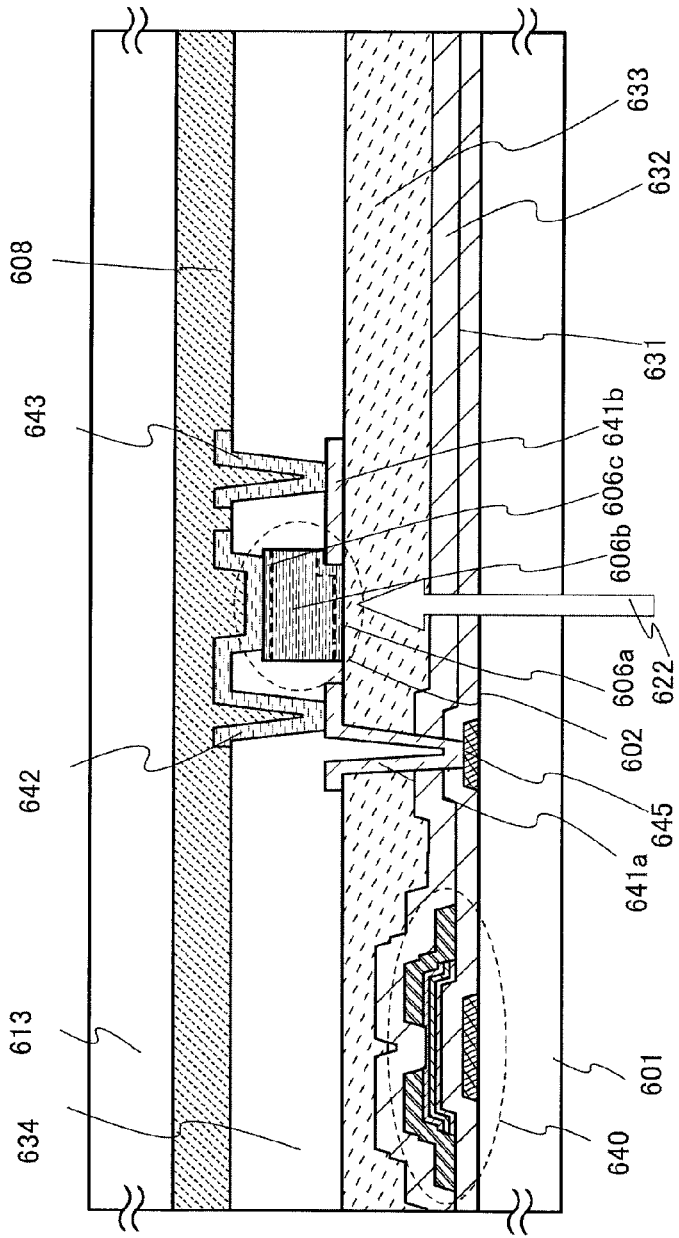

An example of a semiconductor device having an image sensor function is illustrated in FIG. 12A. FIG. 12A illustrates an equivalent circuit of a photo sensor, and FIG. 12B is a cross-sectional view illustrating part of the photo sensor.

In a photodiode 602, one electrode is electrically connected to a photodiode reset signal line 658, and the other electrode is electrically connected to a gate of a transistor

640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor layer is denoted by a symbol "OS" so that it can be identified as a transistor including an oxide semiconductor layer. In FIG. 12A, each of the transistor 640 and the transistor 656 is a transistor including an oxide semiconductor layer, to which any of the transistors described in Embodiment 1 can be applied. In this embodiment, an example in which a transistor having a structure similar to that of the transistor 320 described in Embodiment 1 is applied is described. The transistor 640 is a bottom-gate transistor.

FIG. 12B is a cross-sectional view of the photodiode 602 and the transistor 640 in the photosensor. The transistor 640 and the photodiode 602 serving as a sensor are provided over a substrate 601 (an element substrate) having an insulating surface. A substrate 613 is provided over the photodiode 602 and the transistor 640 with an adhesive layer 608 interposed therebetween.

An insulating layer 632, an interlayer insulating layer 633, and an interlayer insulating layer 634 are provided over the transistor 640. The photodiode 602 includes an electrode layer 641b formed over the interlayer insulating layer 633, semiconductor films (a first semiconductor film 606a, a second semiconductor film 606b, and a third semiconductor film 606c stacked over the electrode layer 641b in this order), an electrode layer 642 which is provided over the interlayer insulating layer 634 and electrically connected to the electrode layer 641b through the first to third semiconductor films, and an electrode layer 641a which is provided in the same layer as the electrode layer 641b and electrically connected to the electrode layer 642.

The electrode layer 641b is electrically connected to a conductive layer 643 formed over the interlayer insulating layer 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity type. The first semiconductor film 606a is formed by a plasma CVD method with the use of a semiconductor source gas containing an impurity element belonging to Group 13 (e.g., boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a chemical vapor deposition method, a sputtering method, or the like may be used. The first semiconductor film 606a is preferably formed to a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method with the use of a semiconductor source gas containing an impurity element belonging to Group 15 (e.g., phosphorus (P)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a chemical vapor deposition method, a sputtering method, or the like may be used. The third semiconductor film 606c is preferably formed to a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

Since the mobility of holes generated by the photoelectric effect is lower than that of electrons, a PIN photodiode has better characteristics when a surface on the p-type semiconductor film side is used as a light-receiving surface. Here, an example in which light received by the photodiode 602 from a surface of the substrate 601, over which the PIN photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive layer. Note that the n-type semiconductor film side may alternatively be a light-receiving surface.

By using the oxide semiconductor stacked film described in the above embodiments in the transistor 640, when a voltage is applied to the gate electrode layer, electrons move not in the vicinity of the interface between the gate insulating film and the first oxide semiconductor layer but in the vicinity of the interface between the first oxide semiconductor layer and the second oxide semiconductor layer. The first oxide semiconductor layer and the second oxide semiconductor layer are oxide semiconductor layers including the same constituent elements but with different atomic ratios. Thus, the amount of oxygen vacancies formed in the vicinity of the interface with the first oxide semiconductor layer in the second oxide semiconductor layer can be smaller than the amount of oxygen vacancies formed in the vicinity of the interface with the gate insulating film in the first oxide semiconductor layer. Accordingly, even when electrons move in the vicinity of the interface between the first oxide semiconductor layer and the second oxide semiconductor layer, the influence of localized states due to oxygen vacancies can be small. This can suppress variation in electrical characteristics of the transistor, and a highly reliable transistor can be provided.

For a reduction in surface roughness, an insulating layer serving as a planarization insulating layer is preferably used as each of the interlayer insulating layers 633 and 634.

With detection of light that enters the photodiode 602, data on an object can be read. Note that a light source such as a backlight can be used at the time of reading data on an object.

The structures, methods, and the like described in this embodiment can be combined as appropriate with any of the structures, methods, and the like described in the other embodiments.

(Embodiment 5)

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 13A to 13C.

Figure 13A:
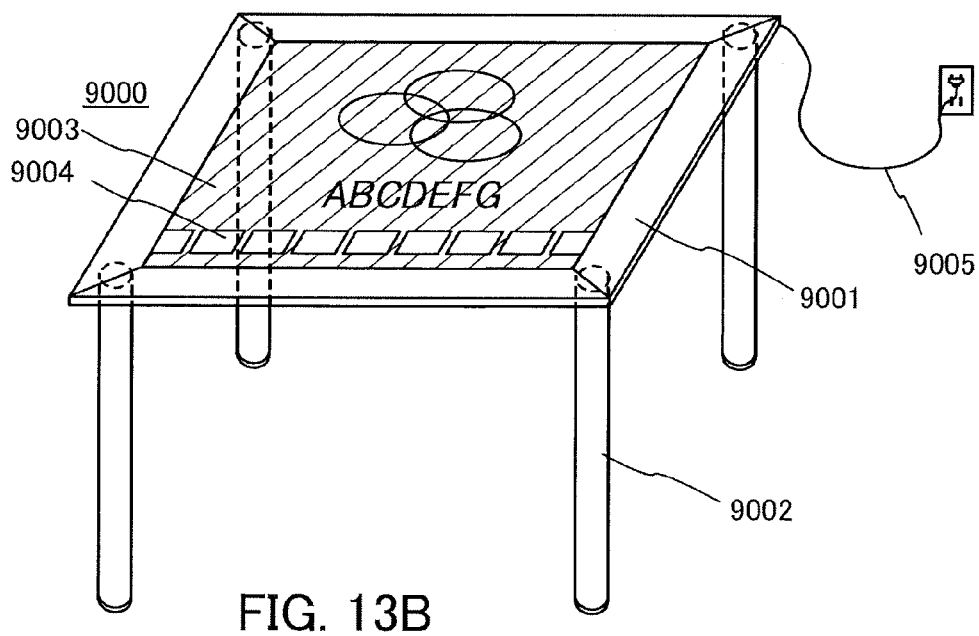
FIGS. 13A to 13C illustrate electronic devices.
Figure 13B:
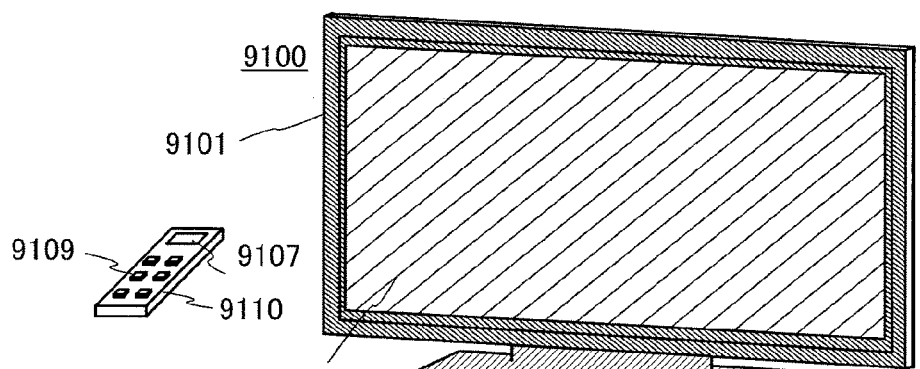
Figure 13C:
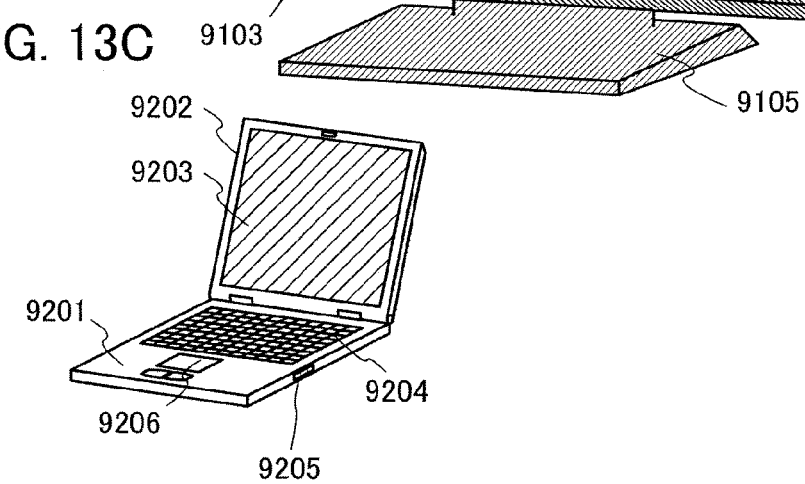

FIG. 13A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The semiconductor device described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 13B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 13B is provided with a receiver, a modem, and the like. With the use of the receiver, the television device 9100 can receive general TV broadcasts. Moreover, when the television device 9100 is connected to a communication network with or without wires via the modem, one-way (from a sender to a receiver) or two-way (between a sender and a receiver or between receivers) information communication can be performed.

The semiconductor device described in any of the above embodiments can be used in the display portions 9103 and 9107, so that the television device and the remote controller can have high reliability.

FIG. 13C illustrates a computer, which includes a main body 9201, a housing 9202, a display portion 9203, a keyboard 9204, an external connection port 9205, a pointing device 9206, and the like.

The semiconductor device described in any of the above embodiments can be used for the display portion 9203, so that the computer can have high reliability.

Figure 14A:
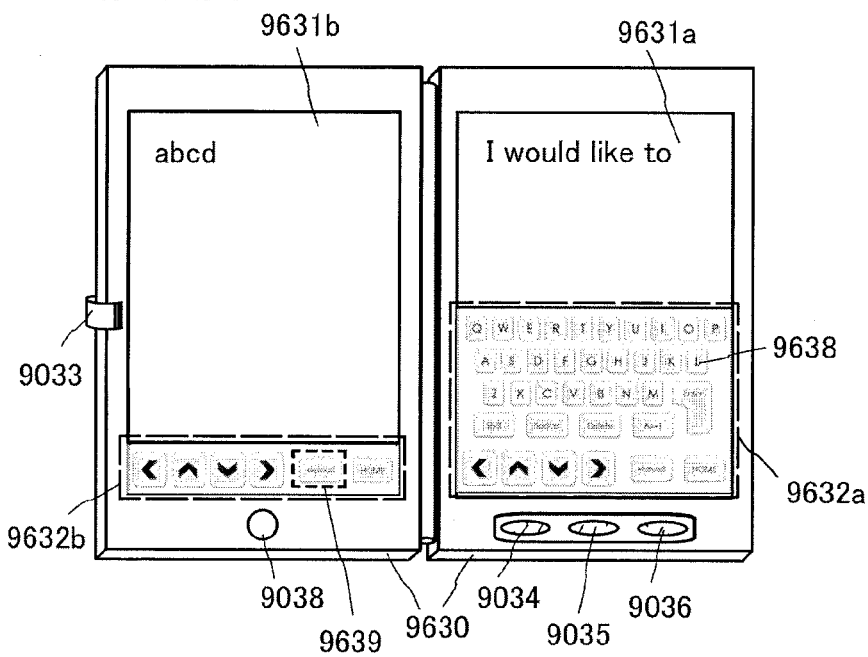
FIGS. 14A to 14C illustrate an electronic device.
Figure 14B:
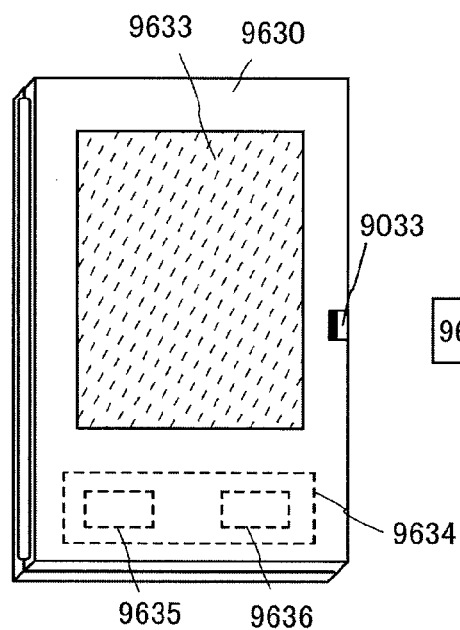

FIGS. 14A and 14B illustrate a tablet terminal that can be folded. In FIG. 14A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used for the display portion 9631a and the display portion 9631b, so that the tablet terminal can have high reliability.

Part of the display portion 9631a can be a touch panel region 9632a, and data can be input by touching operation keys 9638 displayed. Although a structure in which a half region in the display portion 9631a has only a display function and the other half region also has a touch panel function is illustrated as an example, the structure of the display portion 9631a is not limited thereto. The whole display portion 9631a may have a touch panel function. For example, a keyboard is displayed on the whole display portion 9631a so that the display portion 9631a serves as a touch panel; thus, the display portion 963 lb can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display-mode switching button 9034 can switch the display between portrait mode, landscape mode, and the like, and between monochrome display and color display, for example. With the button 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631a and the display portion 963 1b have the same display area in FIG. 14A, an embodiment of the present invention is not limited to this example. The display portion 9631a and the display portion 963 1b may have different areas or different display quality. For example, one of them may be a display panel that can display higher-definition images than the other.

In FIG. 14B, the tablet terminal is folded, and includes the housing 9630, a solar battery 9633, and a charge and discharge control circuit 9634. FIG. 14B illustrates a structure including a battery 9635 and a DCDC converter 9636 as an example of the charge and discharge control circuit 9634.

Since the tablet terminal can be folded in two, the housing 9630 can be closed when the tablet terminal is not in use. Thus, the display portions 9631a and 9631b can be protected, thereby providing a tablet with high endurance and high reliability for long-term use.

The tablet terminal illustrated in FIGS. 14A and 14B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that the solar battery 9633 can be provided on one or two surfaces of the housing 9630, so that the battery 9635 can be charged efficiently. When a lithium ion battery is used as the battery 9635, there is an advantage of downsizing or the like.

Figure 14C:
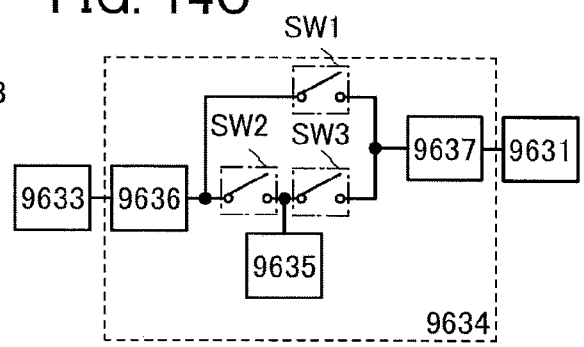

The structure and operation of the charge and discharge control circuit 9634 illustrated in FIG. 14B are described with reference to a block diagram of FIG. 14C. FIG. 14C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 14B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

EXAMPLE 1

In this example, the evaluation results of the crystal state of an oxide semiconductor stacked film are described.

Sample A and Sample B fabricated in this example are described.

Figure 15:
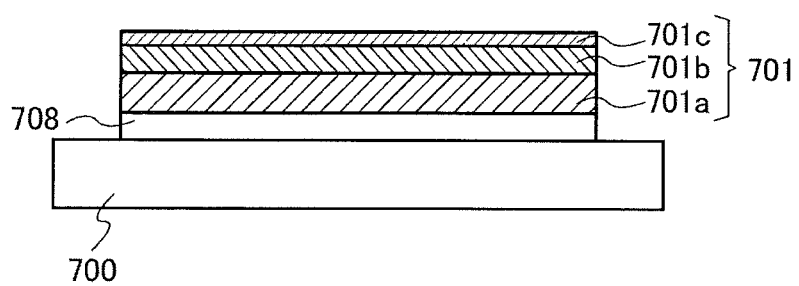
FIG. 15 is a cross-sectional view of a sample.

FIG. 15 illustrates a structure of Sample A and Sample B.

First, a method for fabricating Sample A is described. As a substrate 700, a p-type silicon substrate was used, and the silicon substrate was subjected to reverse sputtering. The conditions of the reverse sputtering were as follows: 50 sccm argon, 0.6 Pa, 200 W (RF), treatment time=3 min, the target-substrate distance=60 mm, the substrate temperature=room temperature.

Next, as an insulating film 708, a silicon oxide film with a thickness of 300 nm was formed over the silicon substrate. The silicon oxide film was formed in the following manner: silicon oxide was used as a sputtering target, 50 sccm oxygen was supplied to a treatment chamber of a sputtering apparatus as a sputtering gas, the pressure in the treatment chamber was controlled to 0.4 Pa, and an RF power of 1.5 kW was supplied. Note that the substrate temperature in the formation of the silicon oxide film was set at 100° C.

Then, the silicon oxide film was subjected to CMP treatment so that the surface roughness (Ra) of the silicon oxide film was 0.2 nm. The conditions of the polishing treatment were as follows: a hard polyurethane pad was used as a polishing pad for CMP; a 5-fold dilute solution of undiluted NP8020 (produced by Nitta Haas Incorporated, a grain size of silica is 60 nm to 80 nm) was used as a slurry; the polishing time was 2 minutes; the polishing pressure was 0.01 MPa, the number of spindle rotations on the substrate fixed side was 60 rpm; and the number of rotations of a table on which the polishing cloth (polishing pad) was fixed was 56 rpm.

Then, a 30-nm-thick IGZO layer with an atomic ratio In:Ga:Zn=1:3:2 was formed over the silicon oxide film as a first oxide semiconductor layer 701a. The IGZO layer was formed under the following conditions: a sputtering target of In:Ga:Zn=1:3:2 [atomic ratio] was used; 30 sccm argon and 15 sccm oxygen were supplied as a sputtering gas into a treatment chamber of a sputtering apparatus; the pressure in the treatment chamber was controlled to 0.4 Pa; and the DC power was 0.5 kW. Note that the substrate temperature in the formation of the IGZO layer was set at 200° C.

Next, a 30-nm-thick IGZO layer with an atomic ratio In:Ga:Zn=3:1:2 was formed as a second oxide semiconductor layer 701b. The IGZO layer was formed under the following conditions: a sputtering target of In:Ga:Zn=3:1:2 [atomic ratio] was used; 45 sccm oxygen was supplied as a sputtering gas into a treatment chamber of a sputtering apparatus; the pressure in the treatment chamber was controlled to 0.4 Pa; and the DC power was 0.5 kW. Note that the substrate temperature in the formation of the IGZO layer was set at 250° C.

Then, a 30-nm-thick IGZO layer with an atomic ratio In:Ga:Zn=1:3:2 was formed as a third oxide semiconductor layer 701c. The IGZO layer was formed under the following conditions: a sputtering target of In:Ga:Zn=1:3:2 [atomic ratio] was used; 30 sccm argon and 15 sccm oxygen were supplied into a treatment chamber of a sputtering apparatus; the pressure in the treatment chamber was controlled to 0.4 Pa; and the DC power was 0.5 kW. Note that the substrate temperature in the formation of the IGZO layer was set at 200° C.

The first to third oxide semiconductor layers 701a to 701c were successively formed without being exposed to the air.

Through the foregoing steps, Sample A was fabricated.

Next, a method for fabricating Sample B is described. Sample B is different from Sample A in the structure of the oxide semiconductor stacked film 701. Only the difference is described below.

After the insulating film 708 is subjected to CMP treatment, the first oxide semiconductor layer 701a, the second oxide semiconductor layer 701b, and the third oxide semiconductor layer 701c were formed.

As the first oxide semiconductor layer 701, a 30-nm-thick IGZO layer with an atomic ratio In:Ga:Zn=1:3:2 was formed over the silicon oxide film. The IGZO layer was formed under the following conditions: a sputtering target of In:Ga:Zn=1:3:2 [atomic ratio] was used; 30 sccm argon and 15 sccm oxygen were supplied as a sputtering gas into a treatment chamber of a sputtering apparatus; the pressure in the treatment chamber was controlled to 0.4 Pa; and the DC power was 0.5 kW. Note that the substrate temperature in the formation of the IGZO layer was set at 200° C.

Next, a 30-nm-thick IGZO layer with an atomic ratio In:Ga:Zn=1:1:1 was formed as the second oxide semiconductor layer 701b. The IGZO layer was formed under the following conditions: a sputtering target of In:Ga:Zn=1:1:1 [atomic ratio] was used; 45 sccm oxygen was supplied as a sputtering gas into a treatment chamber of a sputtering apparatus; the pressure in the treatment chamber was controlled to 0.4 Pa; and the DC power was 0.5 kW. Note that the substrate temperature in the formation of the IGZO layer was set at 350° C.

Then, a 30-nm-thick IGZO layer with an atomic ratio In:Ga:Zn=1:3:2 was formed as the third oxide semiconductor layer 701c. The IGZO layer was formed under the following conditions: a sputtering target of In:Ga:Zn=1:3:2 [atomic ratio] was used; 30 sccm argon and 15 sccm oxygen were supplied into a treatment chamber of a sputtering apparatus; the pressure in the treatment chamber was controlled to 0.4 Pa; and the DC power was 0.5 kW. Note that the substrate temperature in the formation of the IGZO layer was set at 200° C.

Next, a cross-sectional image of the second and third oxide semiconductor layers 701b and 701c in Sample A was taken with a TEM. Similarly, a cross-sectional image of the second and third oxide semiconductor layers 701b and 701c in Sample B was taken with a TEM.

Specifically, to examine the presence of crystal grains, the size of crystal grains, and the distribution state of crystal grains, Sample A and Sample B were subjected to an ion milling method. Then, the cross sections were observed with a high resolution transmission electron microscope ("H9000-NAR": TEM manufactured by Hitachi, Ltd.) at an acceleration voltage of 300 kV.

Figure 16A:
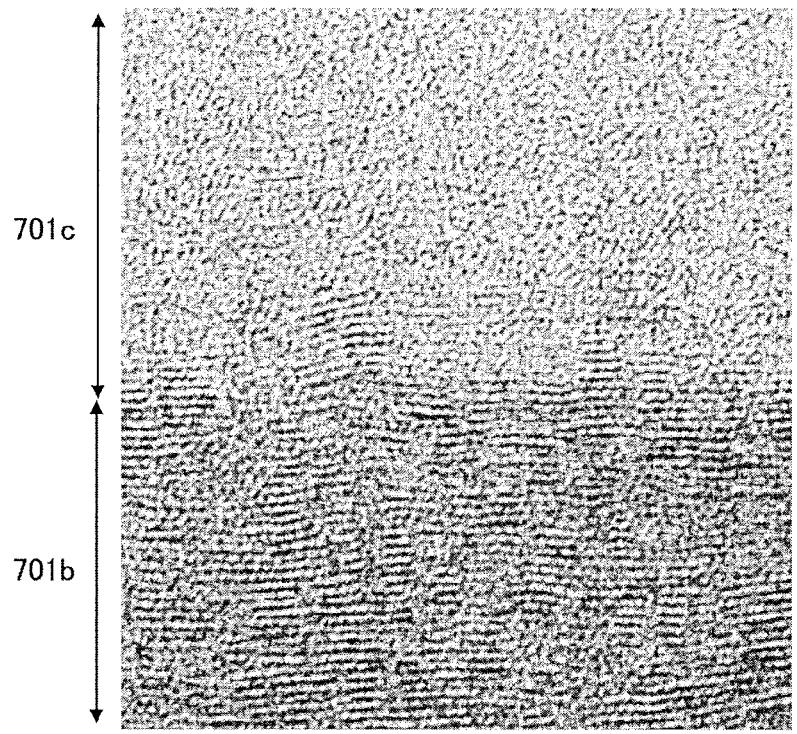
FIGS. 16A and 16B are TEM photographs of cross sections of Sample A and Sample B.
Figure 16B:
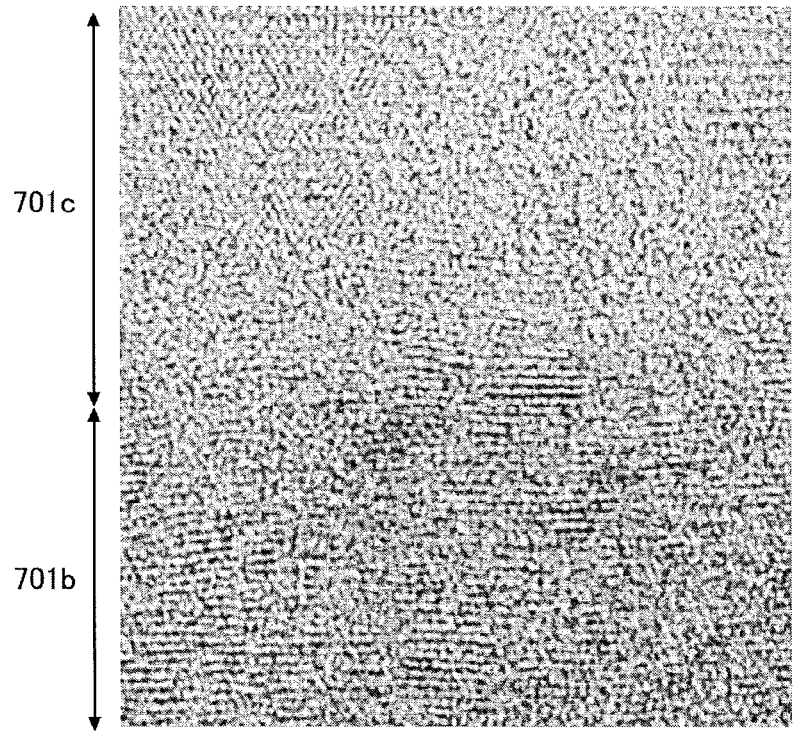

FIGS. 16A and 16B show the cross section observation results of the interface between the second oxide semiconductor layer 701b and the third oxide semiconductor layer 701c in Sample A and Sample B. FIG. 16A shows the results of Sample A with 400,000 magnification, and FIG. 16B shows the results of Sample B with 400,000 magnification.

As shown in FIGS. 16A and 16B, the third oxide semiconductor layer 701c formed over the second oxide semiconductor layer 701b was crystallized at the interface with the second oxide semiconductor layer 701b. It was confirmed that the crystallized region in the third oxide semiconductor layer 701c also included a crystal part whose c-axis was aligned in a direction parallel to a normal vector of a surface of the third oxide semiconductor layer 701c, in the same manner as that of the second oxide semiconductor layer 701b. These results indicate that the third oxide semiconductor layer 701c includes a crystal that has been grown using a crystal region included in the second oxide semiconductor layer 701b as a seed crystal.

EXAMPLE 2

In this example, analysis results of the sequentially stacked first to third oxide semiconductor layers by time-of-flight secondary ion mass spectrometry (TOF-SIMS) and X-ray photoelectron spectroscopy (XPS) are described.

First, a sample for analysis is described.

The sample for the analysis of this example includes the first oxide semiconductor layer which is provided over an n-type silicon substrate, the second oxide semiconductor layer which is provided over the first oxide semiconductor layer, and the third oxide semiconductor layer which is provided over the second oxide semiconductor layer. The first to third oxide semiconductor layers each have a thickness of 10 nm.

The first to third oxide semiconductor layers were formed in such a manner that oxide semiconductor layers were sequentially deposited by a sputtering method. The first oxide semiconductor layer was formed under the following condition: a metal oxide target manufactured by a cold press method having an atomic ratio of In:Ga:Zn=1:3:2 was used, and the deposition atmosphere contained oxygen at 10% (the flow rate of oxygen: 20 sccm; the flow rate of argon: 180 sccm). The second oxide semiconductor layer was formed under the following condition: a metal oxide target manufactured by a cold press method having an atomic ratio of In:Ga:Zn=3:1:2 was used, and the deposition atmosphere contained oxygen at 100% (the flow rate of oxygen: 200 sccm). The third oxide semiconductor layer was formed under the following condition: a metal oxide target manufactured by a wet method having an atomic ratio of In:Ga:Zn=1:1:1 was used, and the deposition atmosphere contained oxygen at 10% (the flow rate of oxygen: 20 sccm; the flow rate of argon: 180 sccm). Further, the pressure of a treatment chamber in a sputtering apparatus was set to 0.6 Pa and an AC power of 5 kW was used at the time of forming the first to third oxide semiconductor layers.

TOF-SIMS analysis was performed on the sample. In that analysis, TOF.SIMS 5 manufactured by ION-TOF GmbH was used as an analyzer and Bi was used as a primary ion source. Further, the analysis was performed in the depth direction and an analysis area was 50 μm square.

Analysis results which relate to InO and GaO of the TOF-SIMS analysis results are shown in FIG. 17. In FIG. 17, the horizontal axis represents the depth in the sample (the thickness direction) and the vertical axis represents the secondary ion intensity.

In FIG. 17, an area in the depth range of greater than or equal to 0 nm and less than or equal to 10 nm is the region of the first oxide semiconductor layer; an area in the depth range of greater than 10 nm and less than or equal to 20 nm is the region of the second oxide semiconductor layer; and an area in the depth range of greater than 20 nm and less than or equal to 30 nm is the region of the third oxide semiconductor layer.

In FIG. 17, the second oxide semiconductor layer has higher ion intensity corresponding to InO than the first and third oxide semiconductor layers.

In FIG. 17, the second oxide semiconductor layer has lower ion intensity corresponding to GaO than the first and third oxide semiconductor layers.

In addition, XPS analysis was performed on the sample in the depth direction. In the analysis, VersaProbe manufactured by ULVAC-PHI Inc. was used as a measurement apparatus and Al was used as an X-ray source. Further, Ar was used as a sputtering ion and the acceleration voltage was 3.0 kV. Further, the detection area was 100 μmϕ.

Figure 18:
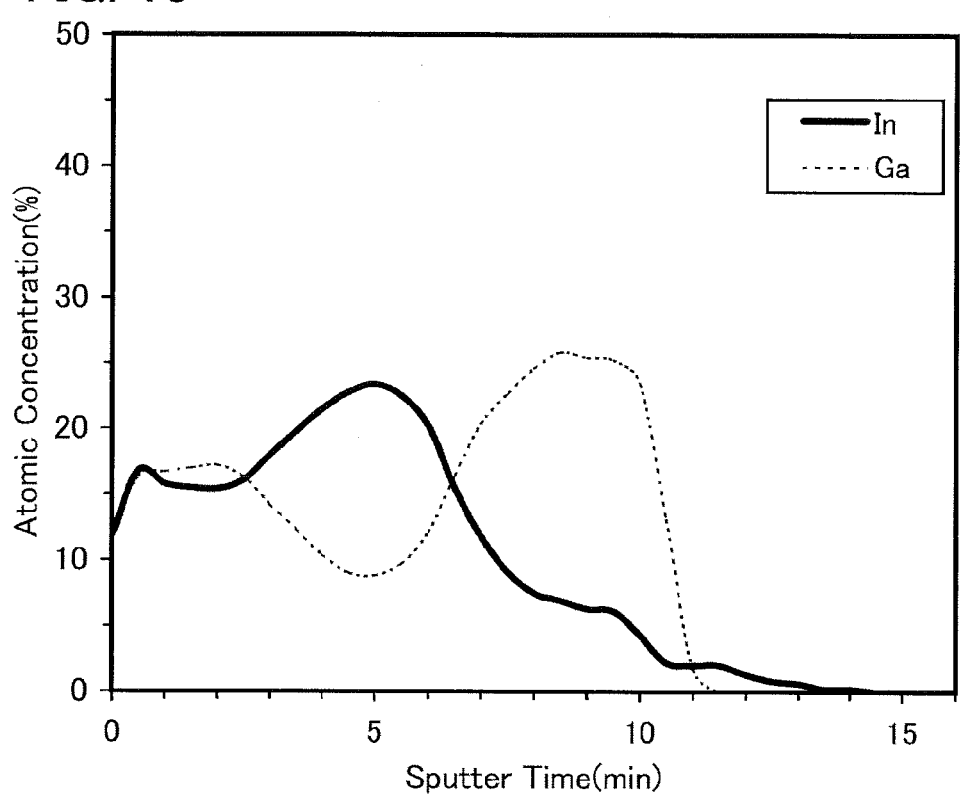
FIG. 18 shows results of XPS analysis.

Analysis results relating to In and Ga of the XPS analysis results are shown in FIG. 18. In FIG. 18, the horizontal axis represents sputtering time and the vertical axis represents the atomic concentration. Note that the sputtering time in FIG. 18 corresponds to the depth direction in the sample in FIG. 17.

The results of FIG. 18 also show that in the first oxide semiconductor layer and the third oxide semiconductor layer, the atomic concentration of Ga is higher than that of In, and that in the second oxide semiconductor layer, the atomic concentration of In is higher than that of Ga.

According to the above description, it is found that a plurality of kinds of oxide semiconductor layers which differ in, for example, the amount of In or the amount of Ga can be formed using sputtering targets which vary in atomic ratio.

EXPLANATION OF REFERENCE

10a: sputtering apparatus, 10b: sputtering apparatus, 10c: sputtering apparatus, 11: substrate supply chamber, 12a: load lock chamber, 12b: load lock chamber, 13: transfer chamber, 14: cassette port, 15: substrate heating chamber, 16: substrate heating chamber, 310: transistor, 320: transistor, 330: transistor, 340: transistor, 350: transistor, 360: transistor, 370: transistor, 380: transistor, 400: substrate, 401: gate electrode layer, 402: gate insulating film, 402a: gate insulating film, 402b: gate insulating film, 403a: oxide semiconductor layer, 403b: oxide semiconductor layer, 403c: oxide semiconductor layer, 404: oxide semiconductor stacked film, 404a: oxide semiconductor layer, 404b: oxide semiconductor layer, 404b1: oxide semiconductor layer, 404b2: oxide semiconductor layer, 404b3: oxide semiconductor layer, 404c: oxide semiconductor layer, 405a: source electrode layer, 405b: drain electrode layer, 406: insulating film, 406a: insulating film, 406b: insulating film, 407: electrode layer, 408: insulating film, 409: gate insulating film, 410: gate electrode layer, 411: oxide semiconductor layer, 413a: region, 413b: region, 414a: region, 414b: region, 420: transistor, 430: transistor, 440: transistor, 450: transistor, 460: transistor, 500: substrate, 501: gate insulating layer, 502: gate insulating layer, 504: interlayer insulating layer, 505: color filter layer, 506: insulating layer, 507: partition, 510: transistor, 511a: gate electrode layer, 511b: gate electrode layer, 512: oxide semiconductor stacked film, 512a: oxide semiconductor layer, 512b: oxide semiconductor layer, 512c: oxide semiconductor layer, 513a: conductive layer, 513b: conductive layer, 520: capacitor, 521a: conductive layer, 521b: conductive layer, 522: oxide semiconductor stacked film, 522a: oxide semiconductor layer, 522b: oxide semiconductor layer, 522c: oxide semiconductor layer, 523: conductive layer, 525: insulating layer, 530: wiring layer intersection, 533: conductive layer, 540: light-emitting element, 541: electrode layer, 542: electroluminescent layer, 543: electrode layer, 601: substrate, 602: photodiode, 606a: semiconductor film, 606b: semiconductor film, 606c: semiconductor film, 608: adhesive layer, 613: substrate, 632: insulating layer, 633: interlayer insulating layer, 634: interlayer insulating layer, 640: transistor, 641a: electrode layer, 641b: electrode layer, 642: electrode layer, 643: conductive layer, 645: conductive layer, 656: transistor, 658: photodiode reset signal line, 659: gate signal line, 671: photosensor output signal line, 672: photosensor reference signal line, 700: substrate, 701: oxide semiconductor stacked film, 701a: oxide semiconductor layer, 701b: oxide semiconductor layer, 701c: oxide semiconductor layer, 708: insulating film, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive layer, 4020a: gate insulating layer, 4020b: gate insulating layer, 4031: electrode layer, 4032a: insulating layer, 4032b: insulating layer, 4033: insulating layer, 4034: electrode layer, 4036: conductive layer, 4035: spacer, 4038: insulating layer, 4042: insulating layer, 9000: table, 9001: housing, 9002: leg portions, 9003: display portion, 9004: displayed button, 9005: power cord, 9033: clip, 9034: switching button, 9035: power button, 9036: button, 9038: operation button, 9100: television device, 9101: housing, 9103: display portion, 9105: stand, 9107: display portion, 9109: operation key, 9110: remote controller, 9201: main body, 9202: housing, 9203: display portion, 9204: keyboard, 9205: external connection port, 9206: pointing device, 9630: housing, 9631: display portion, 9631a: display portion, 9631b: display portion, 9632a: region, 9632b: region, 9633: solar cell, 9634: charge and discharge control circuit, 9635: battery, 9636: DCDC converter, 9637: converter, 9638: operation keys, 9639: button.

This application is based on Japanese Patent Application serial no. 2012-178617 filed with Japan Patent Office on Aug. 10, 2012, the entire contents of which are hereby incorporated by reference.

The invention claimed is:

1. A display device comprising:
a gate electrode layer;
a first insulating layer over the gate electrode layer;
a first oxide semiconductor layer over the first insulating layer;
a second oxide semiconductor layer over the first oxide semiconductor layer;
a third oxide semiconductor layer over the second oxide semiconductor layer, wherein the third oxide semiconductor layer covers side surfaces in end portions of the first oxide semiconductor layer and side surfaces in end portions of the second oxide semiconductor layer;
a source electrode layer and a drain electrode layer on and in contact with the third oxide semiconductor layer;
a second insulating layer over the source electrode layer and the drain electrode layer; and
a pixel electrode electrically connected to the source electrode layer and the drain electrode layer,
wherein the second oxide semiconductor layer comprises indium, gallium, and zinc, and wherein the second oxide semiconductor layer and the third oxide semiconductor layer comprise crystals.

2. The display device according to claim 1, wherein a c-axis of the crystals is aligned in a direction substantially parallel to a normal vector of a formation surface.

3. The display device according to claim 1,
wherein the first oxide semiconductor layer comprises indium, gallium, and zinc,
wherein the third oxide semiconductor layer comprises indium, gallium, and zinc, and
wherein a proportion of indium in the second oxide semiconductor layer is higher than a proportion of indium in the first oxide semiconductor layer or a proportion of indium in the third oxide semiconductor layer.

4. The display device according to claim 1, wherein the pixel electrode is connected to the source electrode layer or the drain electrode layer through an opening in the second insulating layer.

5. The display device according to claim 1, wherein a concentration of silicon in the first oxide semiconductor layer and the third oxide semiconductor layer is lower than or equal to $3\times10^{18}/cm^3$.

6. A display device comprising:
a gate electrode layer;
a first insulating layer over the gate electrode layer;
a first oxide semiconductor layer over the first insulating layer;
a second oxide semiconductor layer over the first oxide semiconductor layer, wherein end portions of the second oxide semiconductor layer have tapered side surfaces;
a third oxide semiconductor layer over the second oxide semiconductor layer, wherein the third oxide semiconductor layer covers the tapered side surfaces of the second oxide semiconductor layer;
a source electrode layer and a drain electrode layer on and in contact with the third oxide semiconductor layer, the source electrode layer and the drain electrode layer comprising copper;
a second insulating layer over the source electrode layer and the drain electrode layer; and
a pixel electrode electrically connected to the source electrode layer and the drain electrode layer,
wherein the second oxide semiconductor layer comprises indium, gallium, and zinc.

7. The display device according to claim 6, wherein the second oxide semiconductor layer has a crystalline structure in which a c-axis of crystals is aligned in a direction substantially parallel to a normal vector of a formation surface.

8. The display device according to claim 6,
wherein the first oxide semiconductor layer comprises indium, gallium, and zinc,
wherein the third oxide semiconductor layer comprises indium, gallium, and zinc, and
wherein a proportion of indium in the second oxide semiconductor layer is higher than a proportion of indium in the first oxide semiconductor layer or a proportion of indium in the third oxide semiconductor layer.

9. The display device according to claim 6, wherein the pixel electrode is connected to the source electrode layer or the drain electrode layer through an opening in the second insulating layer.

10. The display device according to claim 6, wherein a concentration of silicon in the first oxide semiconductor layer and the third oxide semiconductor layer is lower than or equal to $3\times10^{18}/cm^3$.

11. A display device comprising:
a gate electrode layer;
a first insulating layer over the gate electrode layer;
a first oxide semiconductor layer over the first insulating layer;
a second oxide semiconductor layer over the first oxide semiconductor layer;
a third oxide semiconductor layer over the second oxide semiconductor layer, wherein the third oxide semiconductor layer covers side surfaces of the first oxide semiconductor layer and side surfaces of the second oxide semiconductor layer;
a source electrode layer and a drain electrode layer on and in contact with the third oxide semiconductor layer;
a second insulating layer over the source electrode layer and the drain electrode layer; and
a pixel electrode electrically connected to the source electrode layer and the drain electrode layer,
wherein the second oxide semiconductor layer and the third oxide semiconductor layer comprise crystals,
wherein the gate electrode overlaps with the source electrode layer and the drain electrode layer, and
wherein a bottom of a conduction band in the second oxide semiconductor layer is deeper and farther from a vacuum level than a bottom of a conduction band in the first oxide semiconductor layer and a bottom of a conduction band in the third oxide semiconductor layer.

12. The display device according to claim 11, wherein a c-axis of the crystals is aligned in a direction substantially parallel to a normal vector of a formation surface.

13. The display device according to claim 11, wherein the side surfaces of the first oxide semiconductor layer and the side surfaces of the second oxide semiconductor layer are tapered.

14. The display device according to claim 11,
wherein the first oxide semiconductor layer comprises indium, gallium, and zinc,
wherein the second oxide semiconductor layer comprises indium, gallium, and zinc,
wherein the third oxide semiconductor layer comprises indium, gallium, and zinc, and
wherein a proportion of indium in the second oxide semiconductor layer is higher than a proportion of indium in the first oxide semiconductor layer or a proportion of indium in the third oxide semiconductor layer.

15. The display device according to claim 11, wherein the pixel electrode is connected to the source electrode layer or the drain electrode layer through an opening in the second insulating layer.

16. The display device according to claim 11, wherein a concentration of silicon in the first oxide semiconductor layer and the third oxide semiconductor layer is lower than or equal to $3\times10^{18}/cm^3$.

* * * * *